United States Patent
Suh et al.

(10) Patent No.: US 7,341,908 B2
(45) Date of Patent: Mar. 11, 2008

(54) SEMICONDUCTOR DEVICE AND METHOD OF MANUFACTURING THE SAME

(75) Inventors: Bong-seok Suh, Hwaseong-si (KR); Seung-man Choi, Hwaseong-si (KR); Hong-jae Shin, Seoul (KR); Young-jin Wee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 115 days.

(21) Appl. No.: 11/344,550

(22) Filed: Jan. 30, 2006

(65) Prior Publication Data

US 2006/0170103 A1 Aug. 3, 2006

(30) Foreign Application Priority Data

Jan. 31, 2005 (KR) .................... 10-2005-0008700

(51) Int. Cl.
*H01L 21/8242* (2006.01)
(52) U.S. Cl. .............. 438/240; 257/310; 257/751; 257/E21.17; 257/E21.006; 257/E21.021; 257/E21.304; 257/E21.585
(58) Field of Classification Search .......... 257/310, 257/396, 751, 760, 762, 763, 764, 770, 771, 257/774; 438/270, 700, 240, 678, 680, 681, 438/692
See application file for complete search history.

(56) References Cited

U.S. PATENT DOCUMENTS 6,413,858 B1 * 7/2002 Chopra ................. 438/643
6,479,898 B1 * 11/2002 Hopper et al. ............ 257/751
6,538,324 B1 * 3/2003 Tagami et al. ........... 257/751
6,545,357 B2 * 4/2003 Chopra ................. 257/751
6,893,541 B2 * 5/2005 Chiang et al. ......... 204/192.17
7,041,595 B2 * 5/2006 Chopra ................. 438/643

FOREIGN PATENT DOCUMENTS

| JP | 2001-007204 | 1/2001 |
| KR | 1998-060592 | 10/1998 |
| KR | 2003-0001103 | 1/2003 |
| KR | 2003-0048618 | 6/2003 |
| KR | 2004-0007111 | 1/2004 |

* cited by examiner

*Primary Examiner*—David Nhu
(74) *Attorney, Agent, or Firm*—Mills & Onello LLP

(57) ABSTRACT

Provided are a semiconductor device including a reliable interconnect and a method of manufacturing the same. The semiconductor device includes a substrate, an inter-metal dielectric (IMD) pattern having an opening, an amorphous metallic nitride layer formed on the inner surface of the opening, a diffusion barrier layer formed on the amorphous metallic nitride layer, and a conductive layer filled into the opening having the diffusion barrier layer.

34 Claims, 19 Drawing Sheets

SEMICONDUCTOR DEVICE AND METHOD OF MANUFACTURING THE SAME

This application claims priority from Korean Patent Application No. 10-2005-0008700 filed on Jan. 31, 2005 in the Korean Intellectual Property Office, the contents of which are incorporated herein by reference in their entirety.

BACKGROUND OF THE INVENTION

1. Field of the Invention

The present invention relates to a semiconductor device and a method of manufacturing the same, and more particularly, to a semiconductor having an interconnect structure with improved reliability and a method of manufacturing the same.

2. Description of the Related Art

As transistors have become smaller and smaller, logic devices having higher speeds and higher integration have been made. As the integration of transistors increases, the dimension of interconnects has shrunk. However, as interconnects have become smaller, a delay problem caused by the interconnects has become more acute, and thus, the delay caused by the interconnects has become an obstacle to high-speed logic devices.

Under such a situation, interconnects using copper, which has lower resistance and higher electromigration (EM) tolerance than an aluminum alloy, which was conventionally and generally used as a material of interconnects of large scale integrated (LSI) semiconductor devices, have been actively developed. However, there are problems with using copper: it is not easy to etch and is oxidized during a process for forming the interconnects. Accordingly, a damascene process is used to form a copper interconnect. The damascene process is used to form trenches, which are formed between upper layer interconnects for respectively isolating the upper layer interconnects formed on insulating layers, and vias for connecting the upper layer interconnects to lower layer interconnects or a substrate. The trenches and the vias are filled with copper, and the trenches and the vias are planarized by a chemical mechanical polishing (CMP) process.

A dual damascene process is often advantageously employed because it is used to form a bit line or a word line as well as to form metal interconnects, and it enables vias for connecting the lower layer interconnects to the lower layer interconnects to be simultaneously formed in a multi-layered metal wiring structure. In addition, a step difference generated by the metal interconnects can also be removed through the dual damascene process. Consequently, the dual damascene process facilitates subsequent processes.

Copper (Cu) used in the metal interconnects of a semiconductor device has several characteristics, including a high diffusion rate into an adjacent insulating layer or substrate. The copper diffused into an active area other than the metal interconnects may operate as impurities. Therefore, it is necessary to form a diffusion barrier layer in order to limit diffusion of copper into the insulating layer or substrate.

In a semiconductor device to which a conventional copper interconnect is applied, failure of a semiconductor device may often occur due to thermal stress in a subsequent thermal process. In particular, when a via is formed between an upper interconnect and a lower interconnect, and the upper interconnect and/or the lower interconnect have a large line width, concentration of thermal stress may be created between the upper interconnect and the via or between the via and the lower interconnect, forming a so-called stress induced void (SIV), or vacancy at an upper or lower portion of the via, thereby ultimately resulting in electric shortage. The electric shortage may occur, especially when an insulating layer for covering the interconnects has a small Young's modulus and a large heat expansion coefficient. In such a case, the adhesion property between a via and each of interconnects is deteriorated at the surface where the via and the interconnect contact; thus, the sheet resistance of the interconnect increases, resulting in a deterioration in the reliability of the interconnect.

SUMMARY OF THE INVENTION

The present invention provides a semiconductor device having an interconnect structure with improved reliability.

The present invention also provides a method of manufacturing a semiconductor device having an interconnect structure with improved reliability.

According to an aspect of the present invention, there is provided a semiconductor device including a substrate, an inter-metal dielectric (IMD) pattern having an opening, an amorphous metallic nitride layer formed on the inner surface of the opening, a diffusion barrier layer formed on the amorphous metallic nitride layer, and a conductive layer filled into the opening having the diffusion barrier layer.

According to another aspect of the present invention, there is provided a method of manufacturing semiconductor device, the method including forming a substrate, forming an IMD pattern having an opening on the substrate, sequentially forming an amorphous metallic nitride layer and a diffusion barrier layer on the inner surface of the opening, and forming a conductive layer filled into the opening.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

A semiconductor device and method according to the present invention will now be described more fully hereinafter with reference to the accompanying drawings, in which exemplary embodiments of the invention are shown. It should be noted that, throughout the description, unless noted otherwise, when a layer is described as being formed on another layer or on a substrate, the layer may be formed directly on the other layer or on the substrate, or one or more layers may be interposed between the layer and the other layer or the substrate.

FIGS. 1A through 1D are sectional views illustrating a semiconductor device and a method of manufacturing the same according to a first embodiment of the present invention.

Figure 1A:
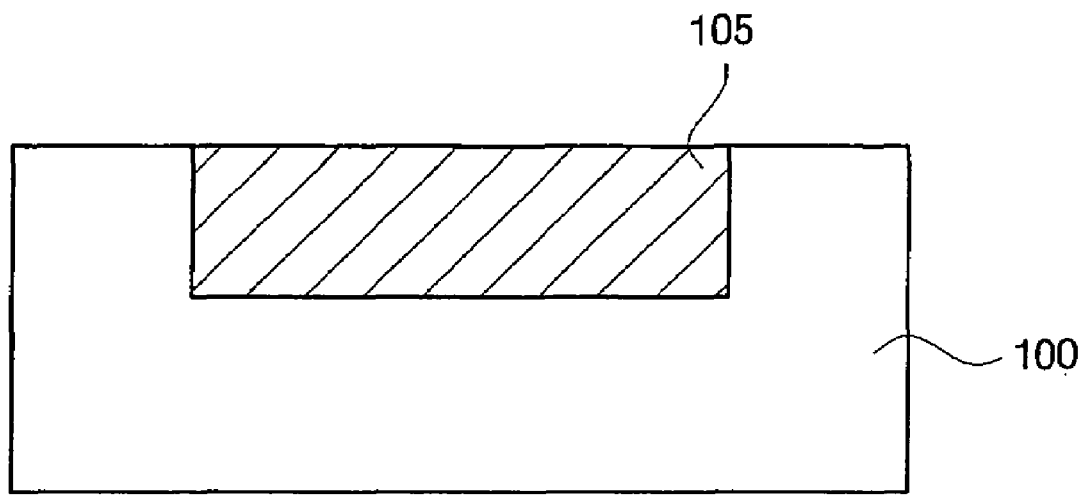
FIGS. 1A through 1D are sectional views illustrating a semiconductor device and a method of manufacturing the same according to a first embodiment of the present invention.

Referring to FIG. 1A, a substrate 100 having a lower interconnect 105 is prepared. The substrate 100 can be a silicon substrate, a silicon on insulator (SOI) substrate, a gallium arsenide substrate, a silicon germanium substrate, a ceramic substrate, a quartz substrate, or a glass substrate for display. The lower interconnect 105 can be made of various kinds of interconnect materials, for example, copper.

Figure 1B:
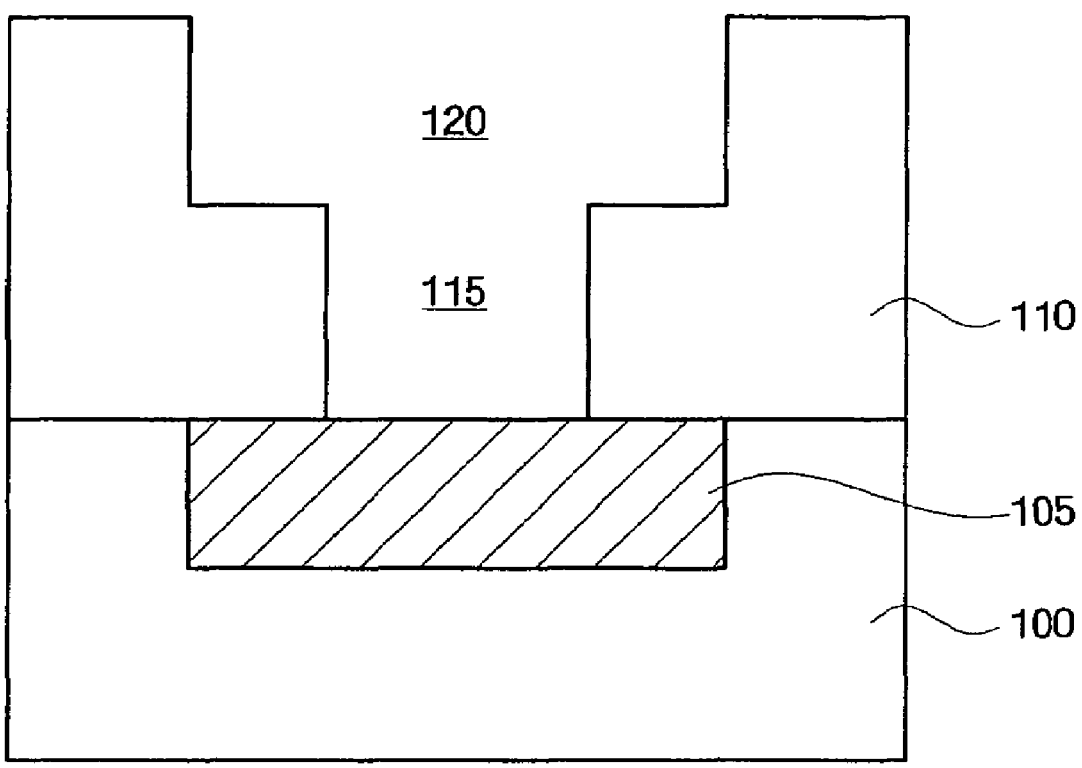

Referring to FIG. 1B, an inter-metal dielectric (IMD) layer (not shown) is formed on the substrate 100 having the lower interconnect 105, and the IMD is patterned using an etch mask to form an IMD pattern 110 including an opening for exposing the lower interconnect 105.

Figure 1C:
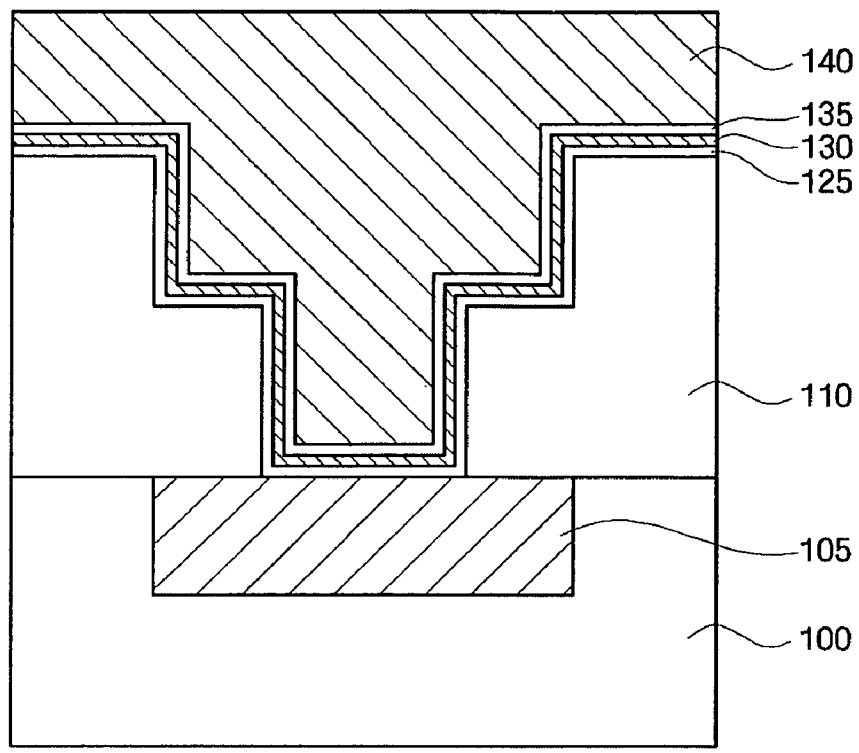
Figure 1D:
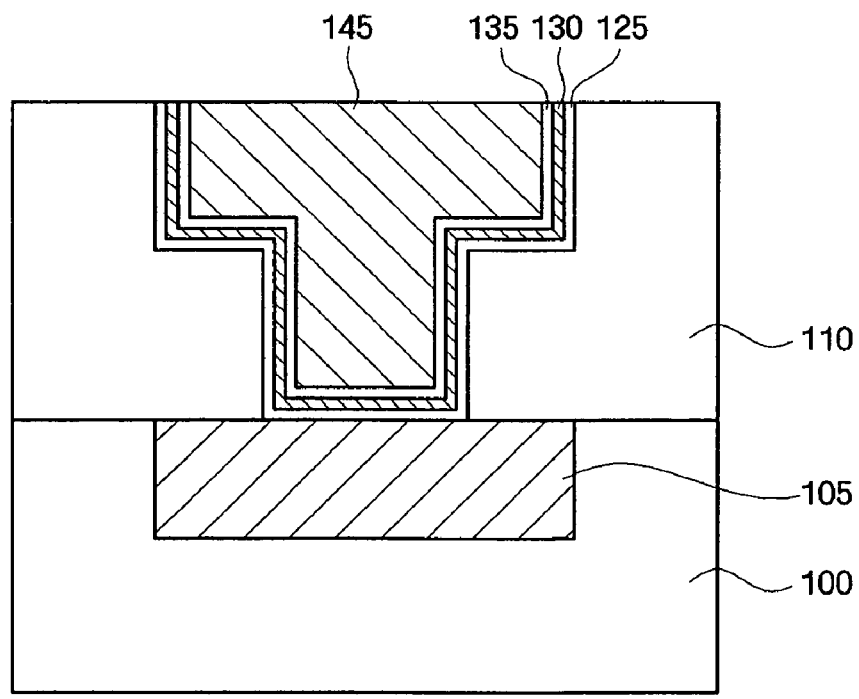

In this case, the opening includes a via 115, which is connected to the lower interconnect 105 to expose the lower interconnect 105, and a trench 120, which is connected to the via 115 and located above the via 115 to define an upper interconnect 145 of FIG. 1D.

The IMD layer may be formed to have an enough thickness to form the via 115 and the trench 120 therein and may be formed using one of organic polymers having a low dielectric constant (i.e., a low-k) and doped oxide layers. The doped oxide layers may be a fluorine-doped oxide (or FSG) layer, a carbon-doped oxide layer, a silicon oxide layer, an HSQ (hydrogen silsesquioxane) (SiO:H) layer, an MSQ (methyl silsesquioxane) (SiO:CH3) layer, or an a-SiOC (SiOC:H) layer. The organic polymers having a low dielectric constant may be a polyallylether resin, a fluoride resin, a siloxane copolymer, a polyallylether fluoride resin, polypentafluorostyrene, a polytetrafluorostyrene resin, a fluoropolyimide resin, polynaphthalene fluoride, and a polycide resin. The IMD layer may be formed using plasma enhanced chemical vapor deposition (PECVD), high density plasma CVD (HDP-CVD), atmospheric pressure CVD (APCVD), or spin coating.

In order to form the IMD pattern 110, a photoresist pattern (not shown) for defining the via 115 is formed on the IMD. Thereafter, the IMD is etched until the lower interconnect 105 is exposed using the photoresist pattern as an etch mask to form the via 115. Next, the photoresist pattern defining the via 115 is removed by ashing and organic stripping.

Thereafter, a photoresist pattern (not shown) for defining the trench 120 is formed on the IMD having the via 115. The photoresist pattern is formed such that the trench 120 and the via 115 overlap each other. Then the trench 120 is formed using the photoresist pattern as an etch mask to complete the IMD pattern 110. Here, an etch-stop layer (not shown) for forming the trench 120 may be formed in IMD. Thereafter, the photoresist pattern for defining the trench 120 is removed by ashing and organic stripping.

In the illustrative embodiment described above, a via-first method in which the via 115 is formed in the IMD and the IMD is etched to form the trench 120 on the via 115 has been described; however, the present invention is not limited to the above-described method. That is, a trench-first method in which the trench 120 is formed before the via 115 may be used to form the IMD pattern 110.

Referring to FIG. 1C, an amorphous metallic nitride layer 125, a diffusion barrier layer 130, and an additional amorphous metallic nitride layer 135 are sequentially formed on the IMD pattern 110 having the via 115 and the trench 120.

The amorphous metallic nitride layer 125 may be formed of a transition metal nitride or transition metal alloy nitride. The concentration of nitrogen in the amorphous metallic nitride layer 125 may be lower than about 31 at % (i.e., atom percent). The amorphous metallic nitride layer 125 may further include an impurity such as Mg, In, Sn, or Al. The concentration of the impurity may be about 1 to 10 at %. The amorphous metallic nitride layer 125 may be formed to a thickness of about 10 to 1,000 Å by reactive sputtering. The amorphous metallic nitride layer 125 may be formed of at least one nitride selected from the group consisting of Ti-nitride, Zr-nitride, Hf-nitride, and an alloy of two or more of Ti-nitride, Zr-nitride, and Hf-nitride.

As the concentration of nitrogen in the metallic nitride layer 125 approaches 0 at %, the metallic nitride layer 125 becomes more like a metallic structure; thus the metallic nitride layer 125 reacts to the interconnect in a subsequent annealing process, and the surface resistance of the interconnect increases. In addition, as the concentration of nitrogen in the metallic nitride layer 125 approaches 31 at %, the amorphous metallic nitride layer 125 becomes more like an amorphous structure; thus the adhesion property between the interconnect and the metallic nitride layer 125 improves and the metallic nitride layer 125 does not react to the interconnect. Therefore, an increase in the surface resistance of the interconnect is prevented. When the concentration of nitrogen in the metallic nitride layer 125 is over about 31 at %, the metallic nitride layer 125 has a crystalline structure; thus the adhesion property between the metallic nitride layer 125 and the interconnect deteriorates, and the surface resistance of the interconnect increases or a vacancy may occur at a bonding surface between the metallic nitride layer 125 and the interconnect.

When Cu is formed in a damascene process, the diffusion barrier layer 130 is used to prevent deterioration of the IMD layer due to diffusion of the Cu conductive material. The diffusion barrier layer 130 may be a single layer formed of a material selected from the group consisting of Ta, Ti, W, Ru, TiW, WBN, TaN, TiN, WN, TaC, WC, TiSiN, and TaSiN, or a multi-layer formed of two or more of these single layers, for example, a multi-layer of TaN and Ta. The diffusion barrier layer 130 may be formed to a thickness of 10 to 1,000 Å by physical vapor deposition (PVD), chemical vapor deposition (CVD), or atomic layer deposition (ALD).

In addition, the additional amorphous metallic nitride layer 135 may be formed of the same material and by the same method as the amorphous metallic nitride layer 125.

Thereafter, a wire conductive layer 140 is formed in the via 115 and the trench 120 having the additional amorphous metallic nitride layer 135, as shown in FIG. 1C. The wire conductive layer 140 may be formed of a material selected from the group consisting of Al, Al alloy, Cu, Cu alloy, Au, Ag, W, and Mo. In addition, the wire conductive layer 140 may be formed by reflowing after forming a conductive material layer through sputtering, CVD, or electroplating.

When the wire conductive layer 140 is formed of Cu or the Cu alloy, the wire conductive layer 140 may be formed by electroplating. In this case, a seed layer (not shown) may be formed to conduct current in an electrolytic process. The seed layer may be formed of a conductive material by sputtering, PVD, CVD, or ALD.

Referring to FIG. 1D, the wire conductive layer 140 is planarized until the IMD pattern 110 is exposed to complete an upper interconnect 145. That is, the wire conductive layer 140 is polished by a CMP process to expose the IMD pattern 110; thus, the upper interconnect 145 formed of a conductive layer having an upper surface at the same level as the upper surface of the IMD pattern 110 is formed.

Figure 2:
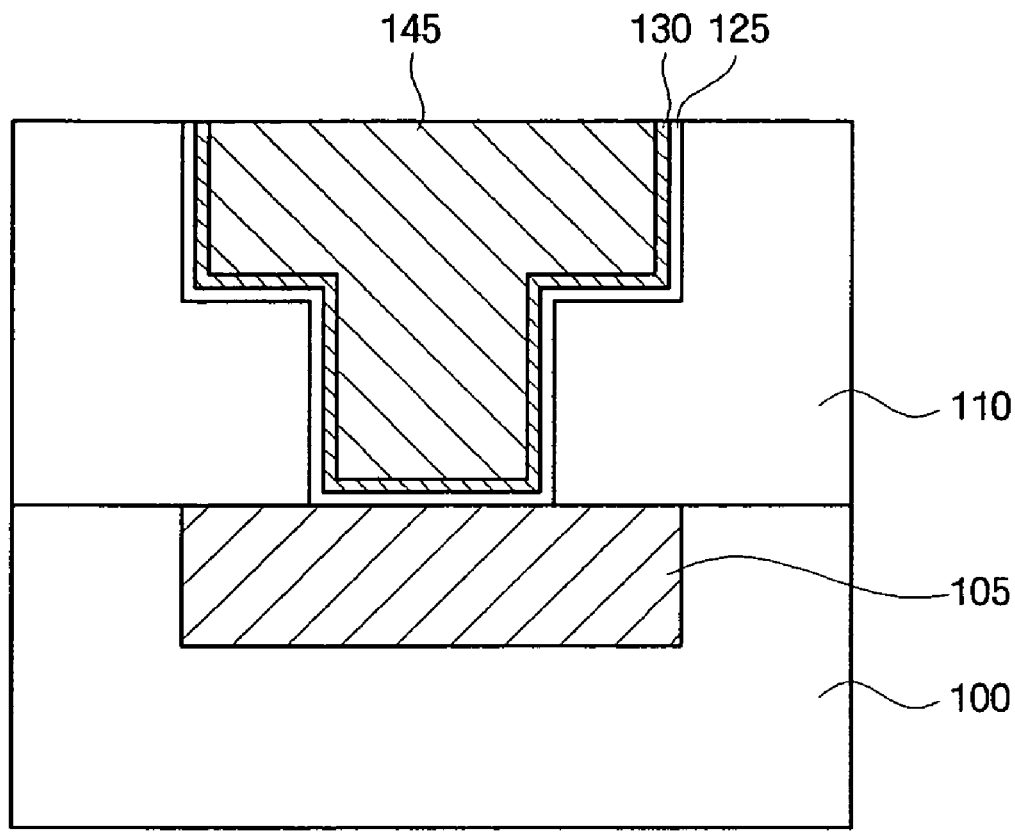
FIG. 2 is a sectional view illustrating a semiconductor device and a method of manufacturing the same according to a second embodiment of the present invention.

FIG. 2 is a sectional view illustrating a semiconductor device and a method of manufacturing the same according to a second embodiment of the present invention. In FIG. 2, elements having the same functions as the elements of the semiconductor device according to the first embodiment of the present invention described in connection with FIGS. 1A through 1D have the same reference numerals, and description thereof will not be repeated. The structures of the semiconductor devices according to the first embodiment and the second embodiment of the present invention are essentially the same except for the following points. Referring to FIG. 2, the semiconductor device according to the second embodiment of the present invention is formed by sequentially forming an amorphous metallic nitride layer 125, a diffusion barrier layer 130, and an upper interconnect 145 on an IMD pattern 110. The additional amorphous metallic nitride layer 135 between the diffusion barrier layer 130 and the upper interconnect 145 is not formed.

FIGS. 3A through 3D are sectional views illustrating a semiconductor device and a method of manufacturing the same according to a third embodiment of the present invention. In FIGS. 3A through 3D, elements having the same functions as the elements of the semiconductor device according to the first embodiment of the present invention described in connection with FIGS. 1A through 1D have the same reference numerals, and descriptions thereof will not be repeated. The structures of the semiconductor devices according to the first embodiment and the third embodiment of the present invention are essentially the same except for the following point. That is, the semiconductor device according to the first embodiment of the present invention has a dual damascene structure; however, the semiconductor device according to the third embodiment of the present invention has a single damascene structure.

Figure 3A:
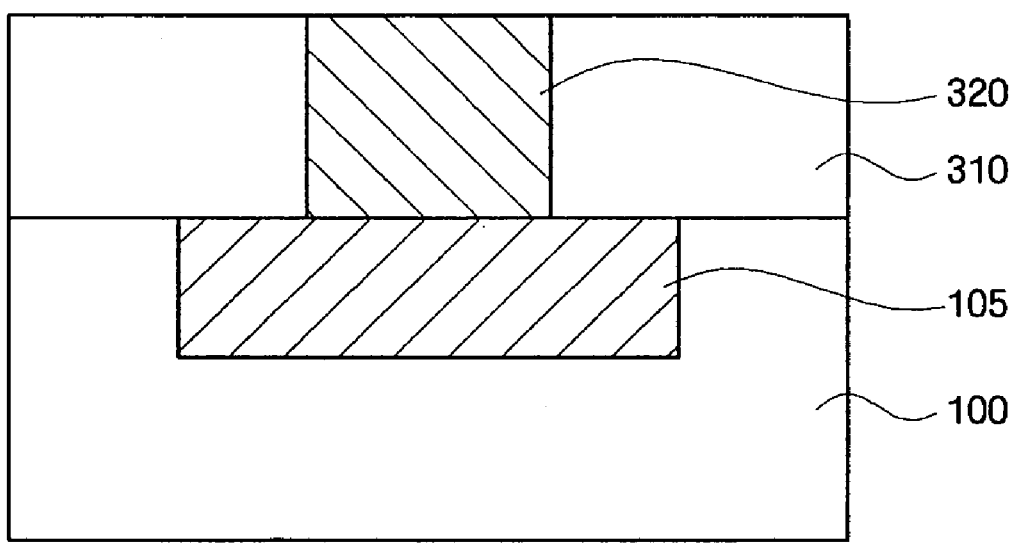
FIGS. 3A through 3D are sectional views illustrating a semiconductor device and a method of manufacturing the same according to a third embodiment of the present invention.

Referring to FIG. 3A, a first IMD pattern 310 including an opening which exposes a lower interconnect 105 is formed on a substrate 100 having the lower interconnect 105. A contact layer 320 is formed in the opening formed in the first IMD pattern 310. In this case, the contact layer 320 may be formed of a conductive material, and the contact layer 320 is electrically connected to the lower interconnect 105. The contact layer 320 may be formed of any material selected from the group consisting of Al, Al alloy, Cu, Cu alloy, Au, Ag, W, and Mo. For example, the contact layer 320 may be formed by depositing W in the opening of the first IMD pattern 310 by sputtering or PVD. Alternatively, the contact layer 320 may be formed by depositing Cu in the opening of the first IMD pattern 310 by electroplating.

Figure 3B:
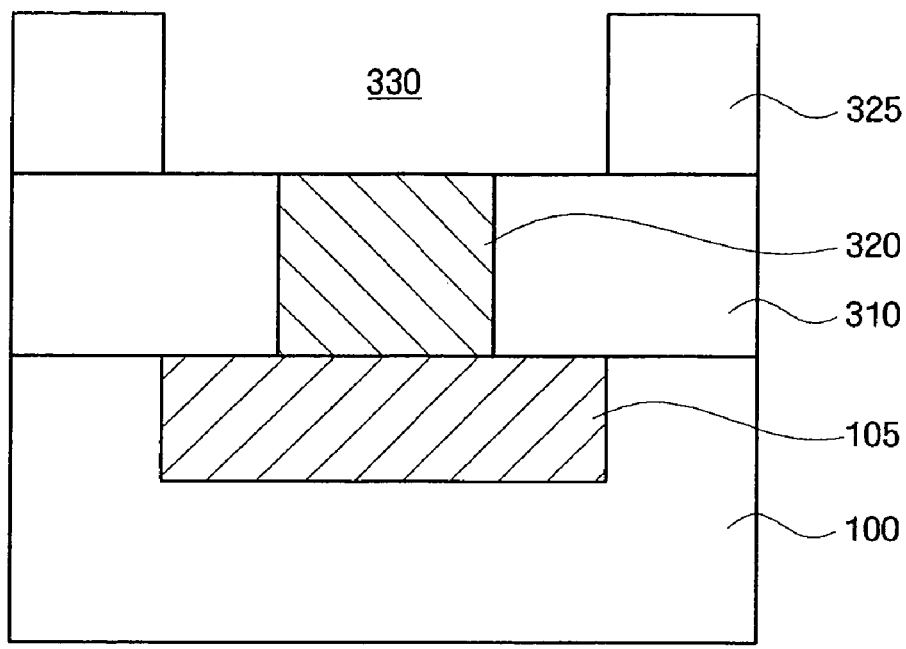

Referring to FIG. 3B, a second IMD pattern 325 including a trench 330, which exposes the contact layer 320, is formed on the resultant structure. In this case, the trench 330 defines an upper interconnect 355 of FIG. 3D.

Figure 3C:
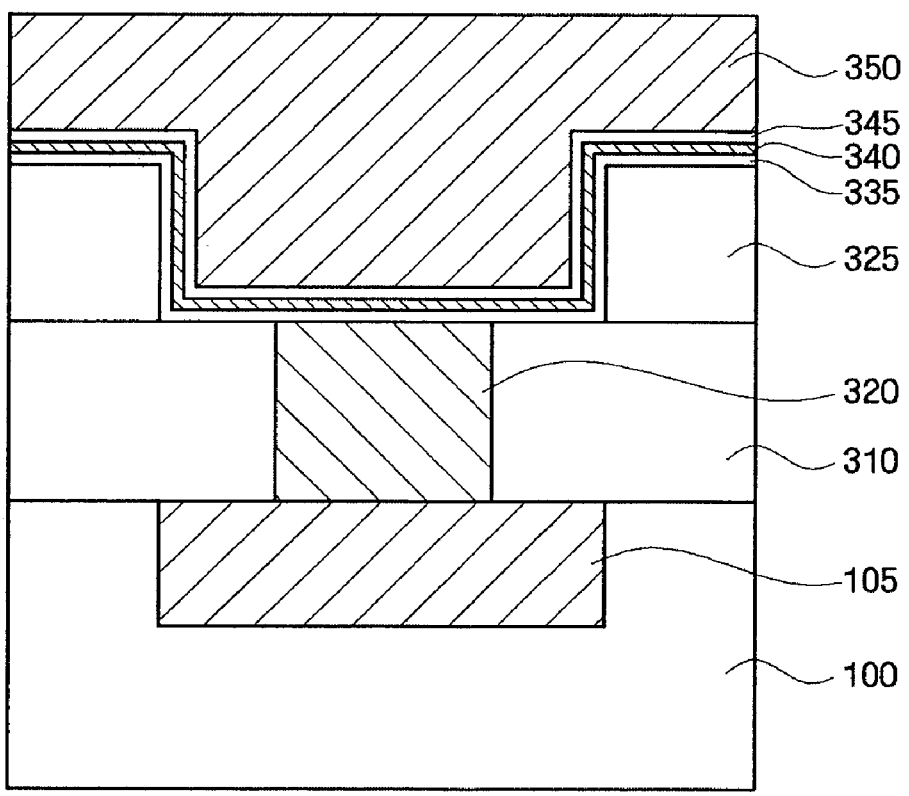

Referring to FIG. 3C, an amorphous metallic nitride layer 335, a diffusion barrier layer 340, and an additional amorphous metallic nitride layer 345 are sequentially formed on the inner surface of the trench 330 and on the second IMD pattern 325. The materials and functions of the amorphous metallic nitride layer 335, the diffusion barrier layer 340, and the additional amorphous metallic nitride layer 345 are the same as those of the amorphous metallic nitride layer 125, the diffusion barrier layer 130, and the additional amorphous metallic nitride layer 135 of FIG. 1C.

Thereafter, as shown in FIG. 3C, a wire conductive layer 350 is formed in the trench 330 having the additional amorphous metallic nitride layer 345. The wire conductive layer 350 may be formed of a material selected from the group consisting of Al, Al alloy, Cu, Cu alloy, Au, Ag, W, and Mo. In addition, the wire conductive layer 350 may be formed by reflowing after forming a conductive material layer through sputtering, CVD, or electroplating.

When the wire conductive layer 350 is formed of Cu or the Cu alloy, the wire conductive layer 350 may be formed by electroplating. In this case, a seed layer (not shown) may be formed to conduct current in an electrolytic process. The seed layer may be formed of a conductive material by sputtering, PVD, CVD, or ALD.

Figure 3D:
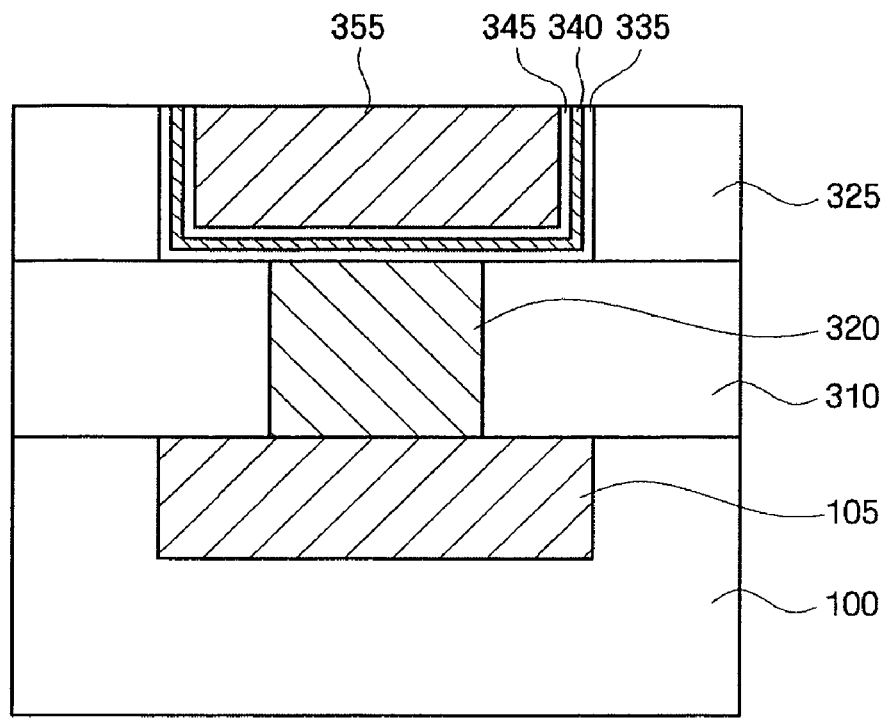

Referring to FIG. 3D, the wire conductive layer 350 is planarized until the second IMD pattern 325 is exposed to complete the upper interconnect 355. That is, the wire conductive layer 350 is polished by a CMP process to expose the second IMD pattern 325; thus, the upper interconnect 355 formed of a conductive layer having an upper surface at the same level as the upper surface of the second IMD pattern 325 is formed.

Figure 4:
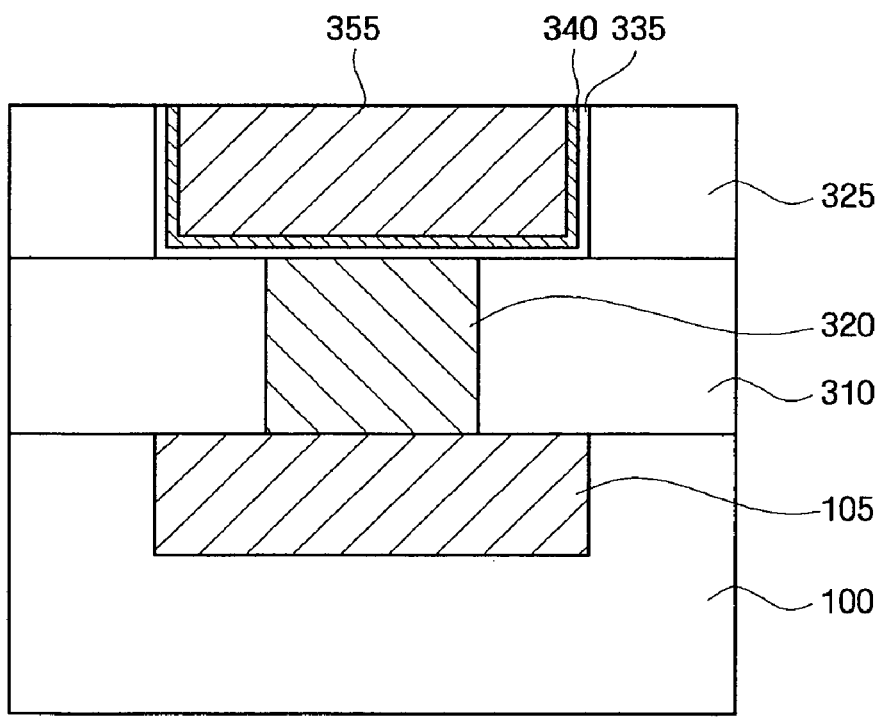
FIG. 4 is a sectional view illustrating a semiconductor device and a method of manufacturing the same according to a fourth embodiment of the present invention.

FIG. 4 is a sectional view illustrating a semiconductor device and a method of manufacturing the same according to a fourth embodiment of the present invention. In FIG. 4, elements having the same functions as the elements of the semiconductor device according to the third embodiment of the present invention described in connection with FIGS. 3A through 3D have the same reference numerals, and descriptions thereof will not be repeated. The structures of the semiconductor devices according to the third embodiment and the fourth embodiment of the present invention are the same except for the following points. Referring to FIG. 4, the semiconductor device according to the fourth embodiment of the present invention is formed by sequentially forming an amorphous metallic nitride layer 335, a diffusion barrier layer 340, and an upper interconnect 355 on a second IMD pattern 325. That is, the additional amorphous metallic nitride layer 345 between the diffusion barrier layer 340 and the upper interconnect 355 is not formed.

The semiconductor device according to the present invention will be described in detail through the following concrete experimental examples. However, the experimental example is for illustrative purposes and other examples and applications can be readily envisioned by a person of ordinary skill in the art. Since a person skilled in the art can sufficiently analogize the technical contents which are not described in the following concrete experimental examples, the description thereof is omitted.

EXPERIMENTAL EXAMPLE 1

The effect of a metallic nitride layer formed of TiZrN on the characteristic of an interconnect was measured using the following experiment. A TiZrN thin layer was formed on a substrate by reactive sputtering using a target, which was formed of a Ti—Zr alloy including 90 wt % of Ti and 10 wt % of Zr, while flowing Ar gas and $N_2$ gas. In this case, six test samples including 0, 5, 28, 34, 40, and 50 at % of nitrogen in the TiZrN thin layer were prepared by differentiating the flow rate of $N_2$ gas. Group IV transition metals such as Ti and Zr form a solid solution, and TiN and ZrN form a solid solution.

Experimental Example 1 will now be described with reference to FIGS. 5A through 8B.

FIGS. 5A through 5F are scanning electron microscope (SEM) images of each test sample.

Figure 5A:
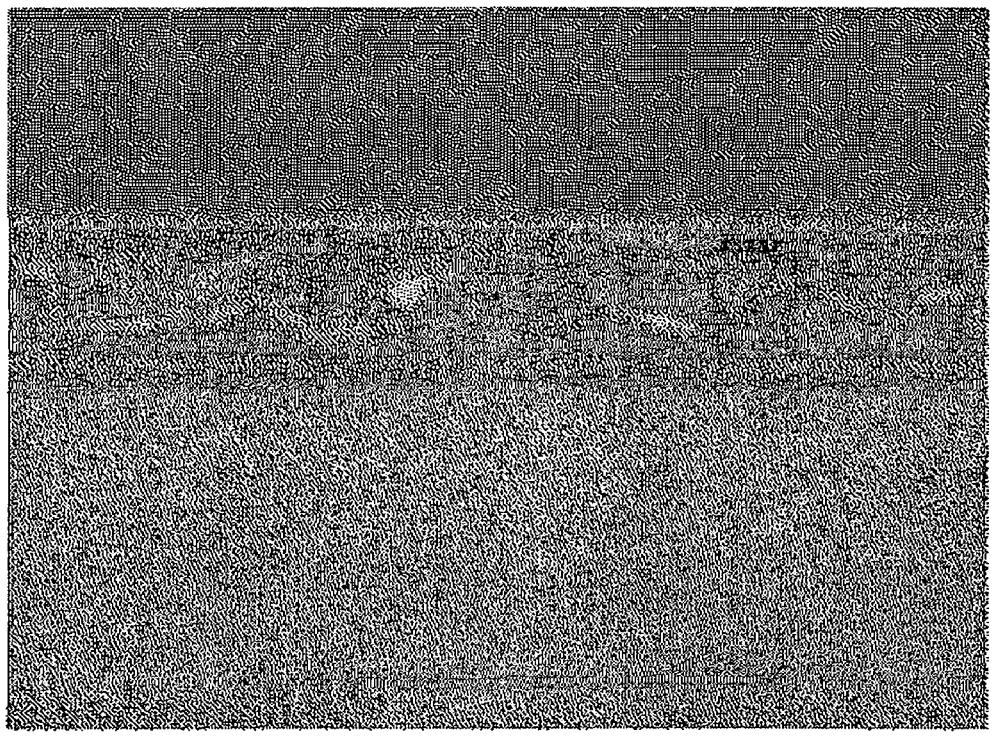
FIGS. 5A through 5F are scanning electron microscope (SEM) images illustrating crystalline states of metallic nitride layers according to changes in the concentration of nitrogen.
Figure 5B:
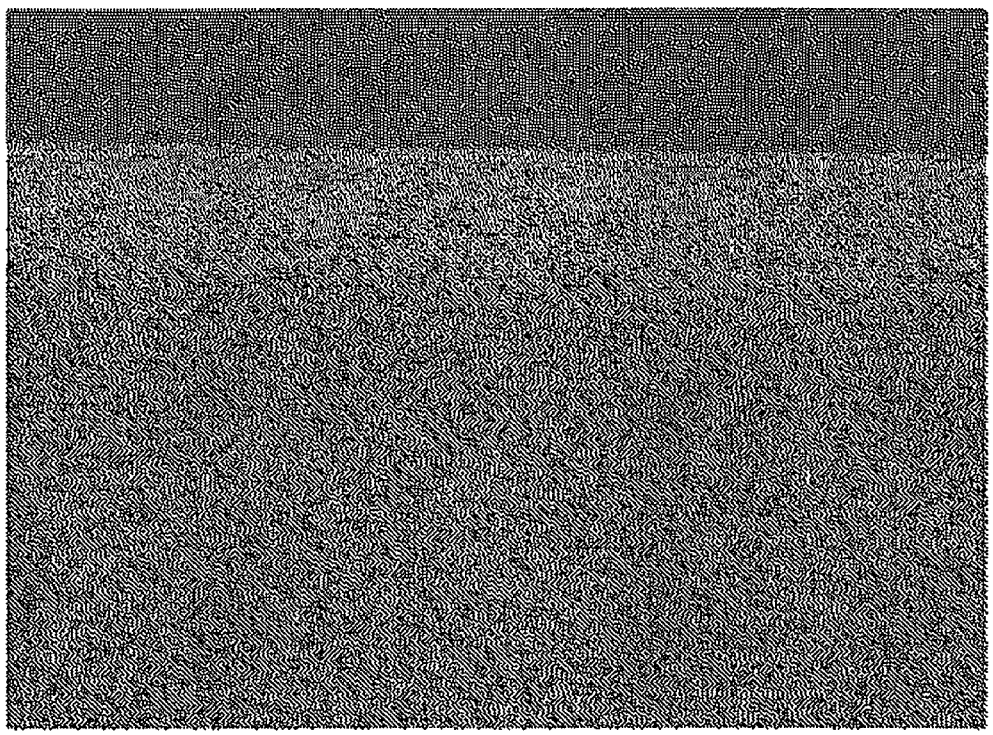
Figure 5C:
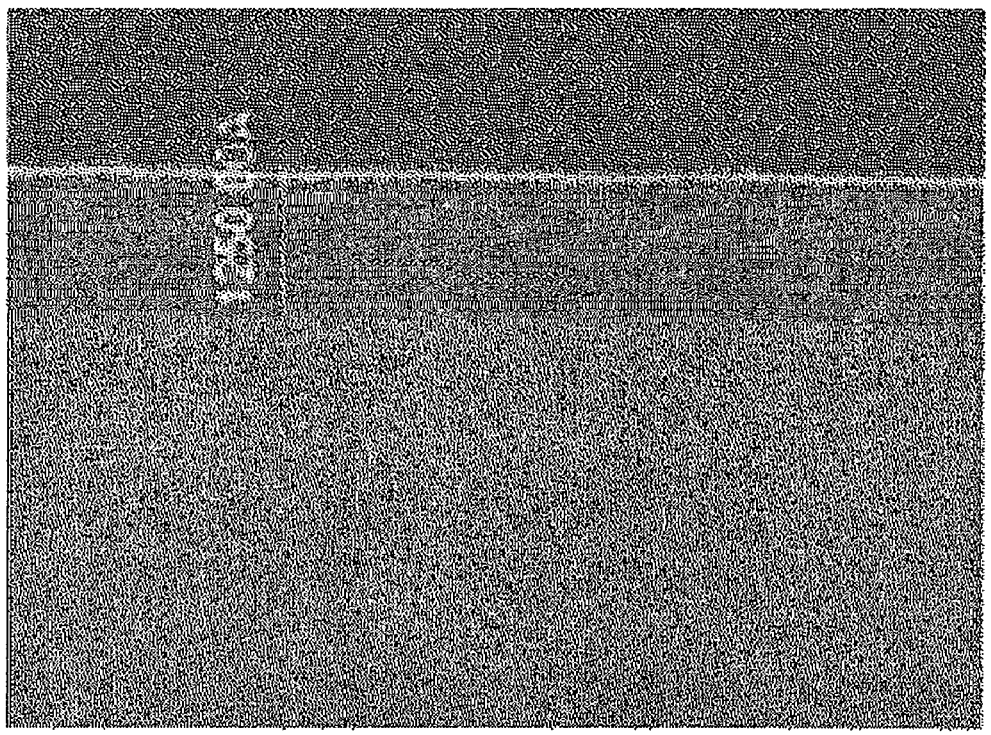
Figure 5D:
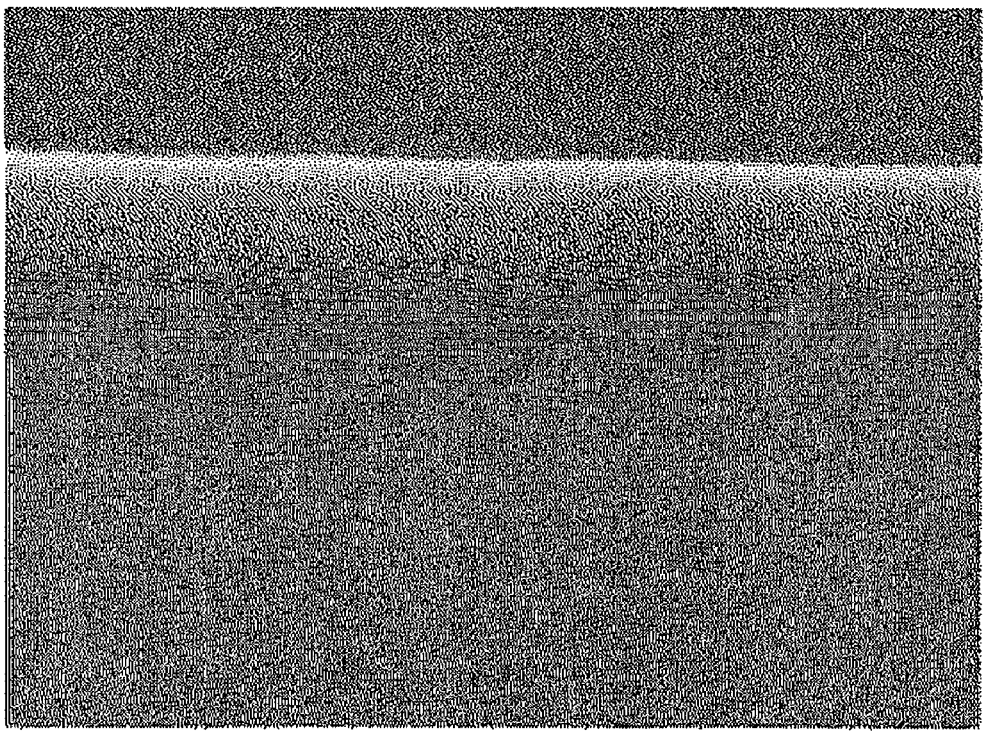
Figure 5E:
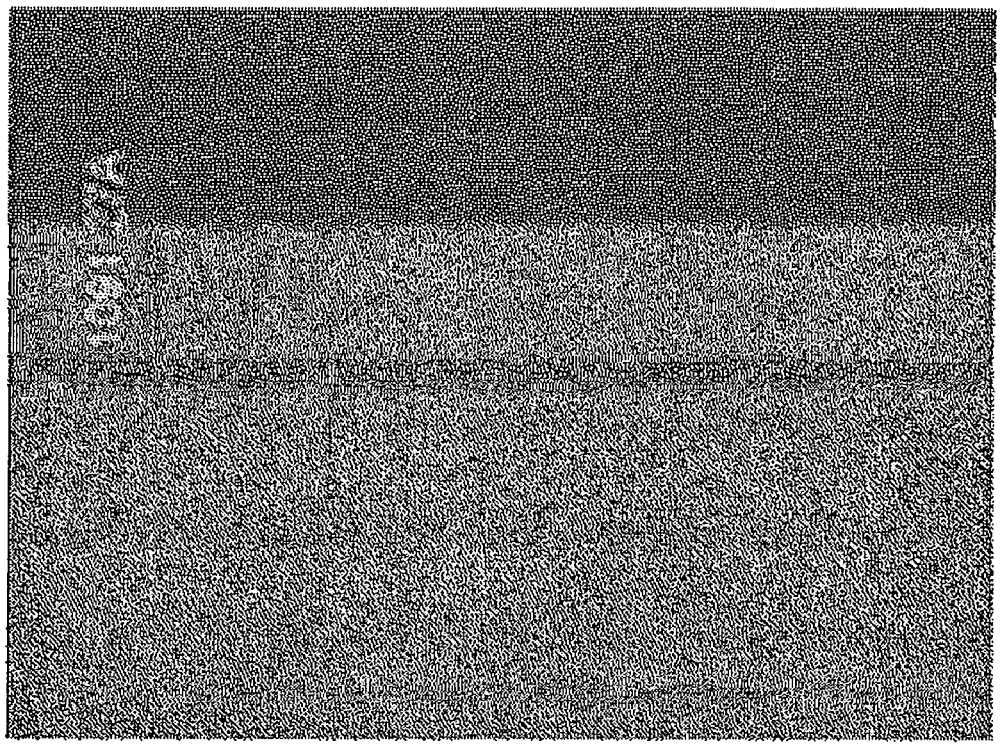
Figure 5F:
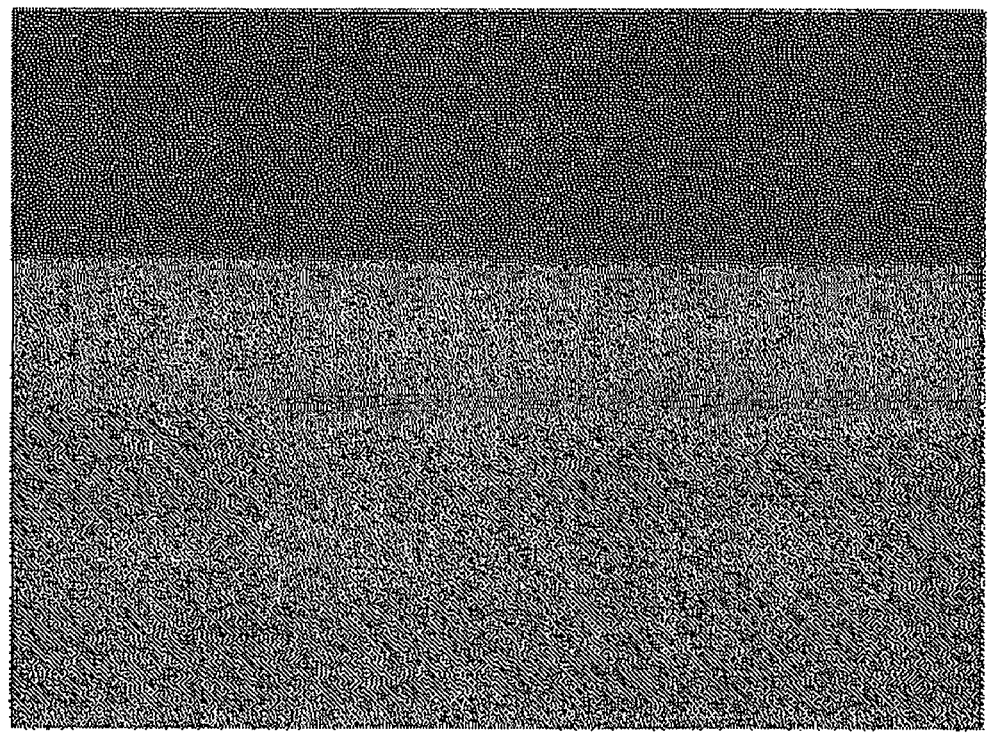

FIG. 5A illustrates a TiZrN layer having 0% N concentration, which will be referred to as TiZrN(0) hereafter. FIG. 5B illustrates a TiZrN layer having 5% N concentration, which will be referred to as TiZrN(5) hereafter. FIG. 5C illustrates a TiZrN layer having 28% N concentration, which will be referred to as TiZrN(28) hereafter. FIG. 5D illustrates a TiZrN layer having 34% N concentration, which will be referred to as TiZrN(34) hereafter. FIG. 5E illustrates a TiZrN layer having 40% N concentration, which will be referred to as TiZrN(40) hereafter. FIG. 5F illustrates a TiZrN layer having 50% N concentration, which will be referred to as TiZrN(50) hereafter.

Referring to FIGS. 5A and 5B, TiZrN(0) and TiZrN(5) have the characteristic of a metallic film, which has stretched and torn fractured surfaces due to plastic deformation. Referring to FIGS. 5C and 5D, TiZrN(28) and TiZrN(34) have the characteristic of an amorphous film, which has fractured surfaces without crystals. Referring to FIGS. 5E and 5F, TiZrN(40) and TiZrN(50) have the characteristic of a crystalline film having columnar fractured surfaces.

Figure 6A:
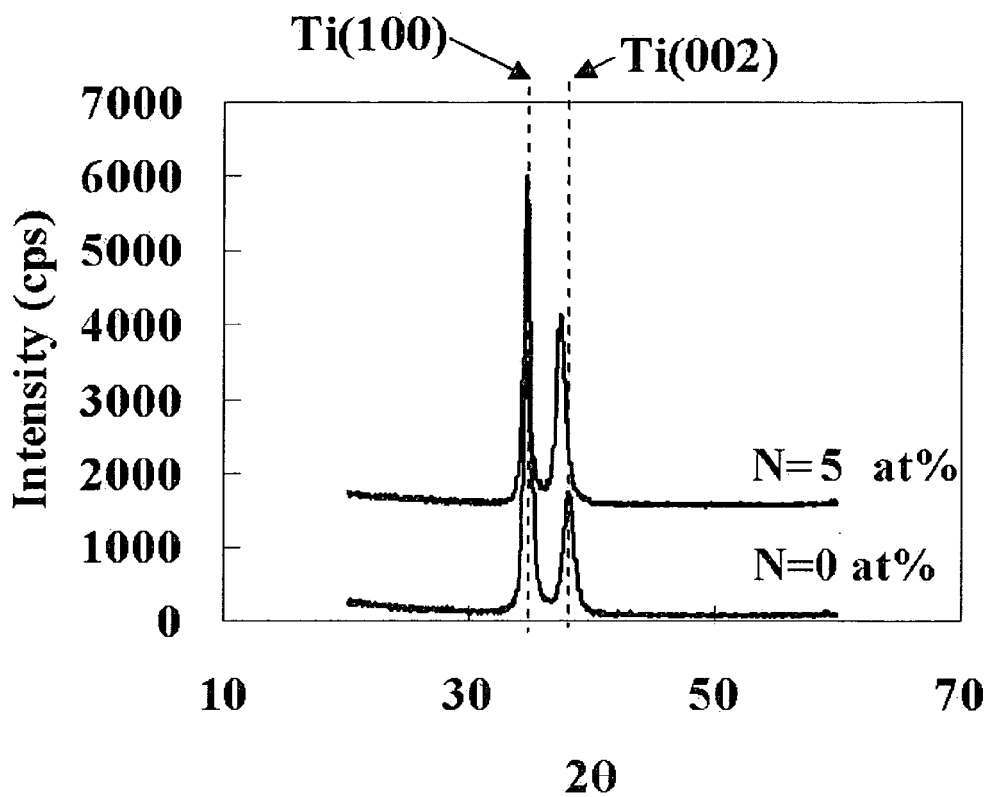
FIGS. 6A and 6B are graphs illustrating X-ray diffraction (XRD) patterns of the metallic nitride layers of FIGS. 5A and 5B.

FIG. 6A illustrates X-ray diffraction (XRD) patterns for the metallic nitride layers shown in FIGS. 5A and 5B. In the case of the XRD pattern for TiZrN(0) and TiZrN(5), peaks occur near 35.06°, which is 2θ value corresponding to Ti(100), and near 38.39°, which is 2θ value corresponding to Ti(002). Thus, it is known that TiZrN(0) and TiZrN(5) have a metallic characteristic.

Figure 6B:
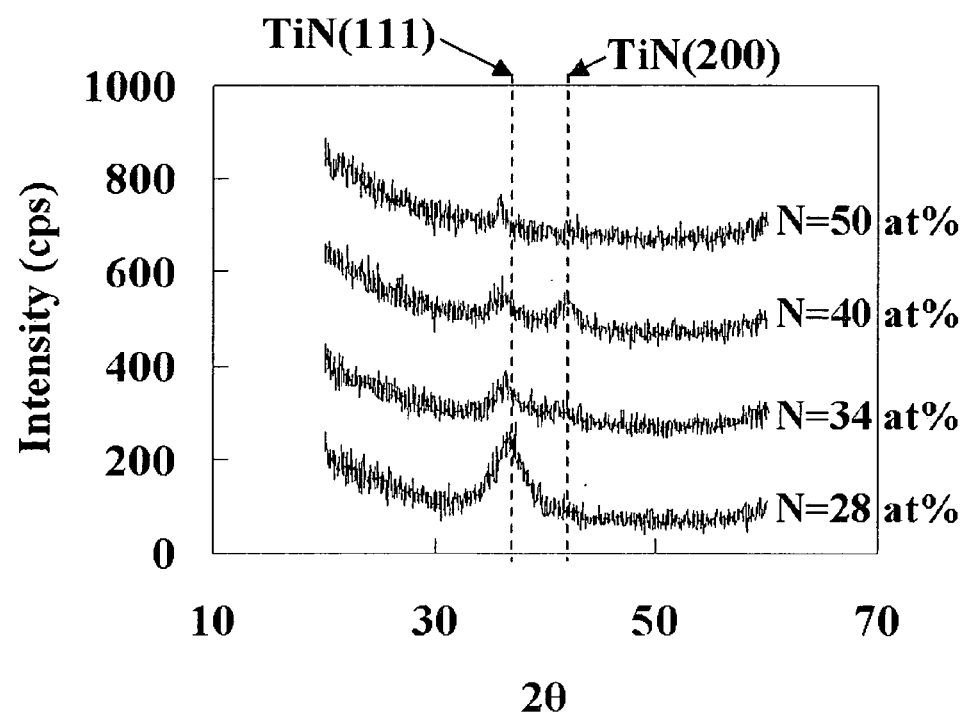

FIG. 6B is an XRD pattern for the metallic nitride layers shown in FIGS. 5C through 5F. In the case of the XRD pattern for TiZrN(28) and TiZrN(34), a sharp peak corresponding to a particular 2θ value does not occur, which means TiZrN(28) and TiZrN(34) have an amorphous characteristic.

In addition, in the case of the XRD pattern for TiZrN(40) and TiZrN(50), peaks occur near 36.64°, which is 2θ value corresponding to TiN(111), and near 42.59°, which is 2θ value corresponding to TiN(200). Thus, it is known that TiZrN(40) and TiZrN(50) are crystals. In general, TiN and ZrN form a solid solution; thus the XRD peak for a TiZrN layer occurs between the XRD peak for a TiN layer and the XRD peak for a ZrN. The target formed of the Ti—Zr alloy including 90 wt % of Ti and 10 wt % of Zr was used in Experimental Example 1. Accordingly, the XRD peak for the TiZrN layer is similar to the XRD peak for the TiN layer.

When the concentration of nitrogen is about 0%, the metallic nitride layer has a metallic structure. As the concentration of nitrogen increases, the metallic nitride layer has an amorphous structure. When the concentration of nitrogen is over 40 at %, the metallic nitride layer has a crystalline structure.

FIGS. 7A through 7F are SEM images illustrating Cu surfaces on the test samples of FIGS. 5A through 5F after forming a Cu layer and performing an annealing process. That is, a Cu layer is formed to a thickness of 50 Å on a metallic nitride layer having a thickness of 50 Å, which is formed on a substrate. Thereafter, an annealing is performed on the resultant structure at a temperature of 400° C. for five minutes under a non-reactive gas atmosphere, for example, a vacuum, Ar gas, or inert gas.

Figure 7A:
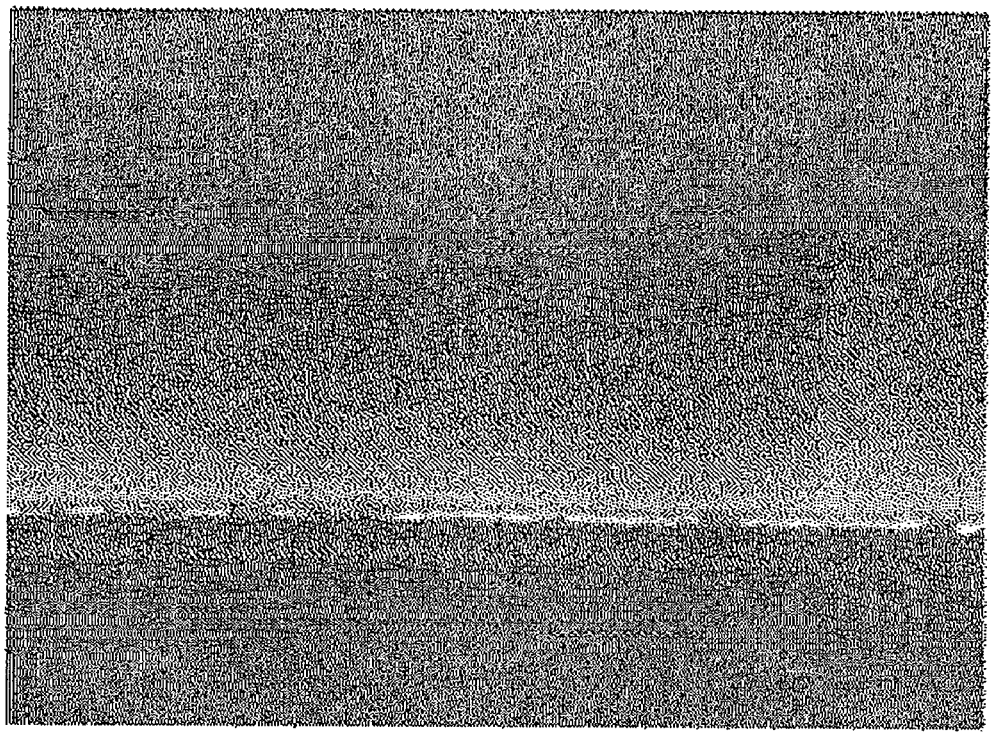
FIGS. 7A through 7F are SEM images illustrating the adhesion property between metallic nitride layers and copper (Cu) according to changes in the concentration of nitrogen.
Figure 7B:
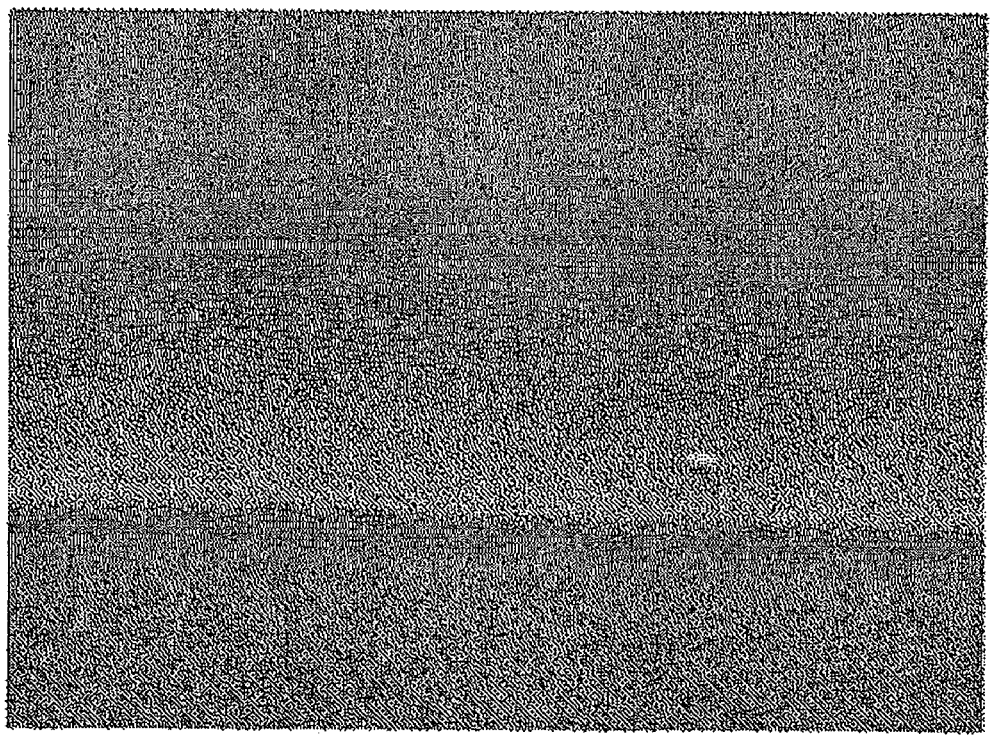
Figure 7C:
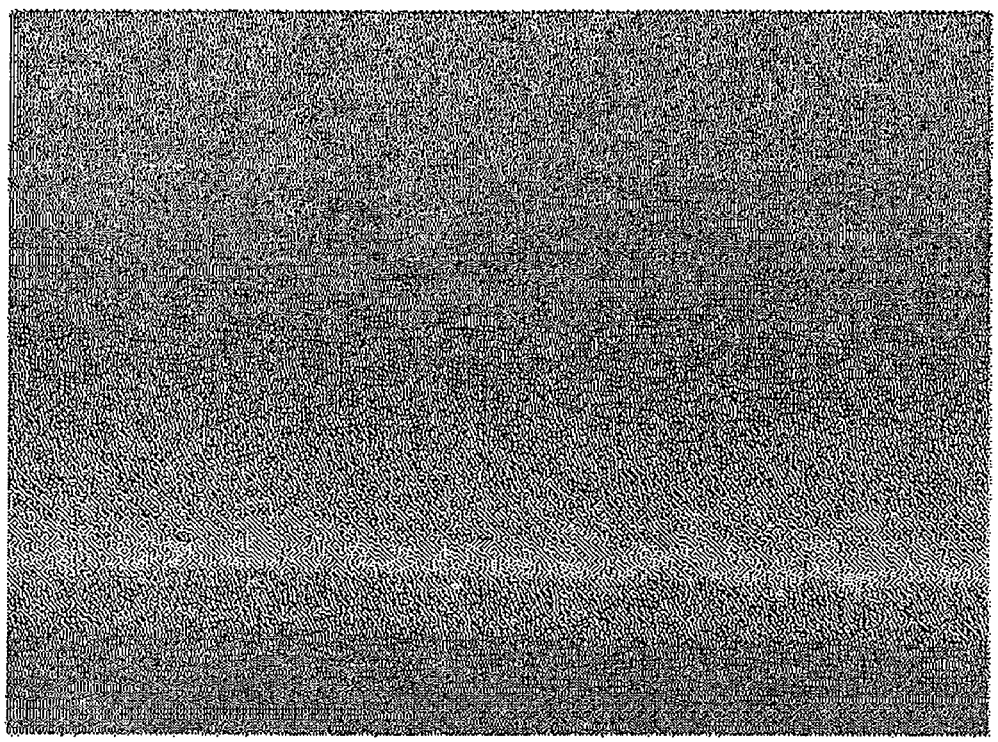
Figure 7D:
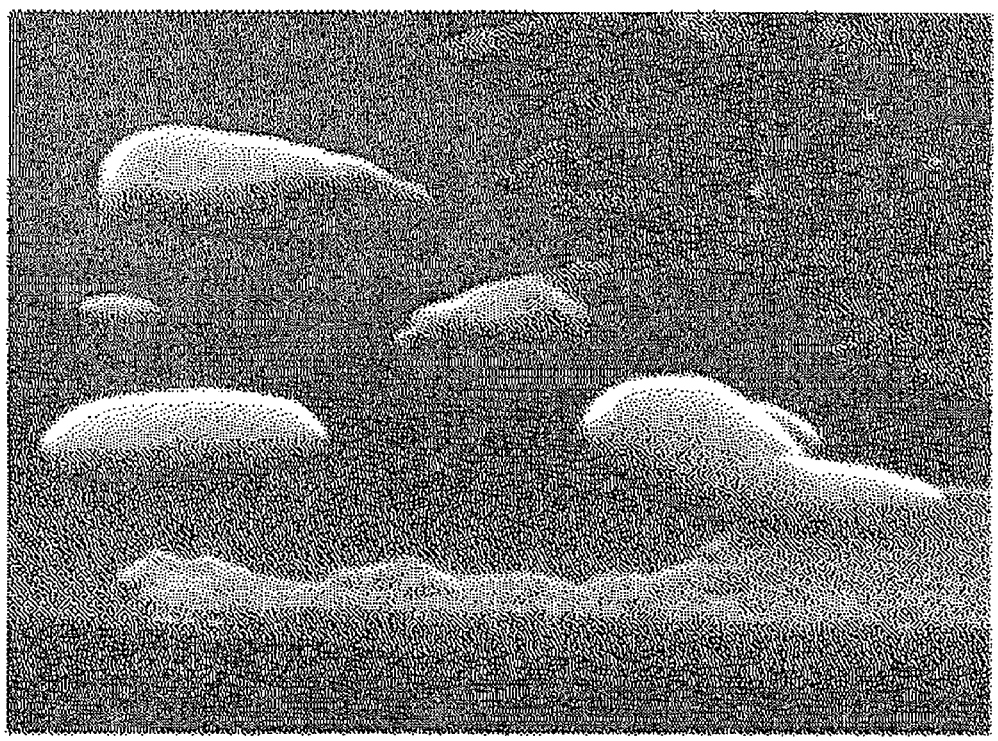
Figure 7E:
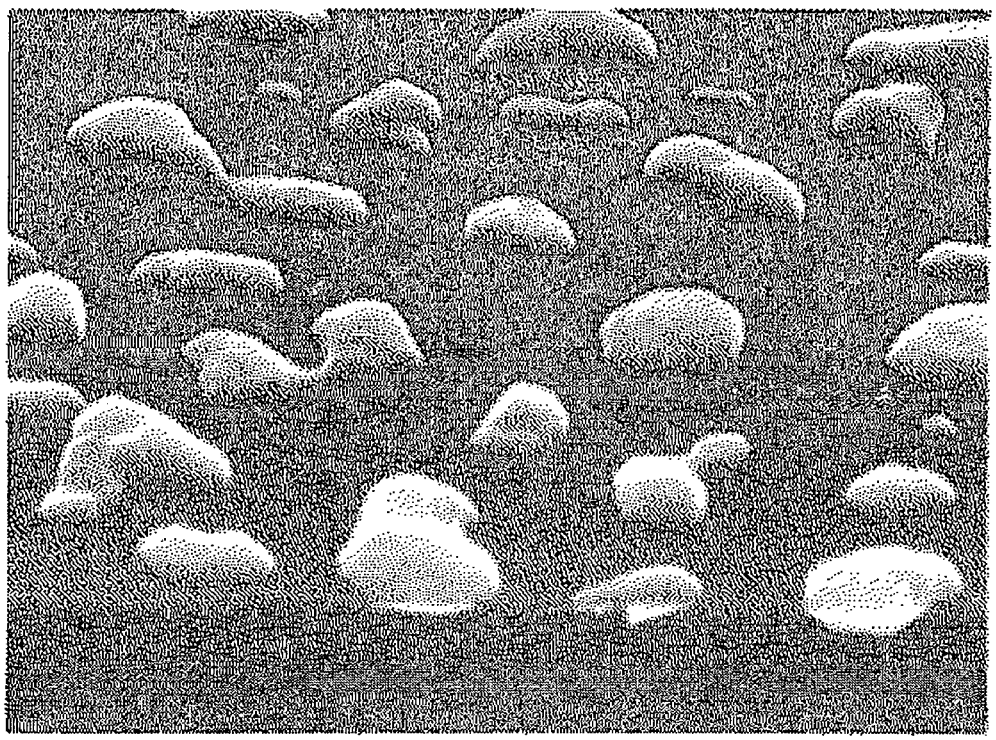
Figure 7F:
Figure 8A:
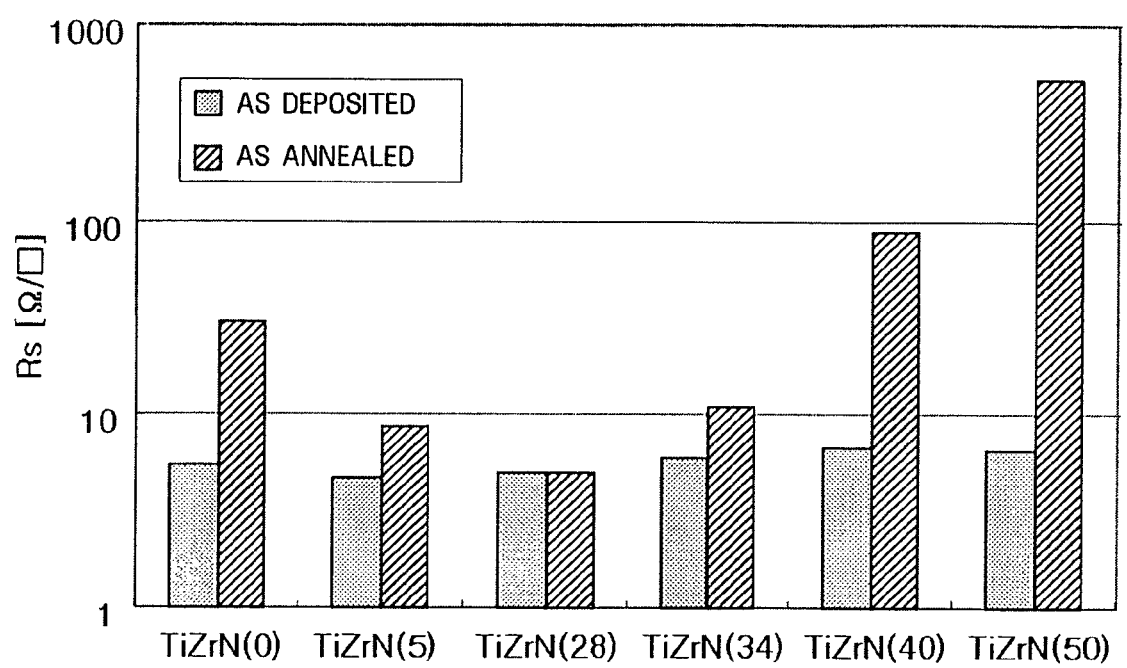
FIG. 8A is a graph illustrating surface resistance levels of the samples of FIGS. 7A through 7F with respect to Cu as deposited and as annealed.
Figure 8B:
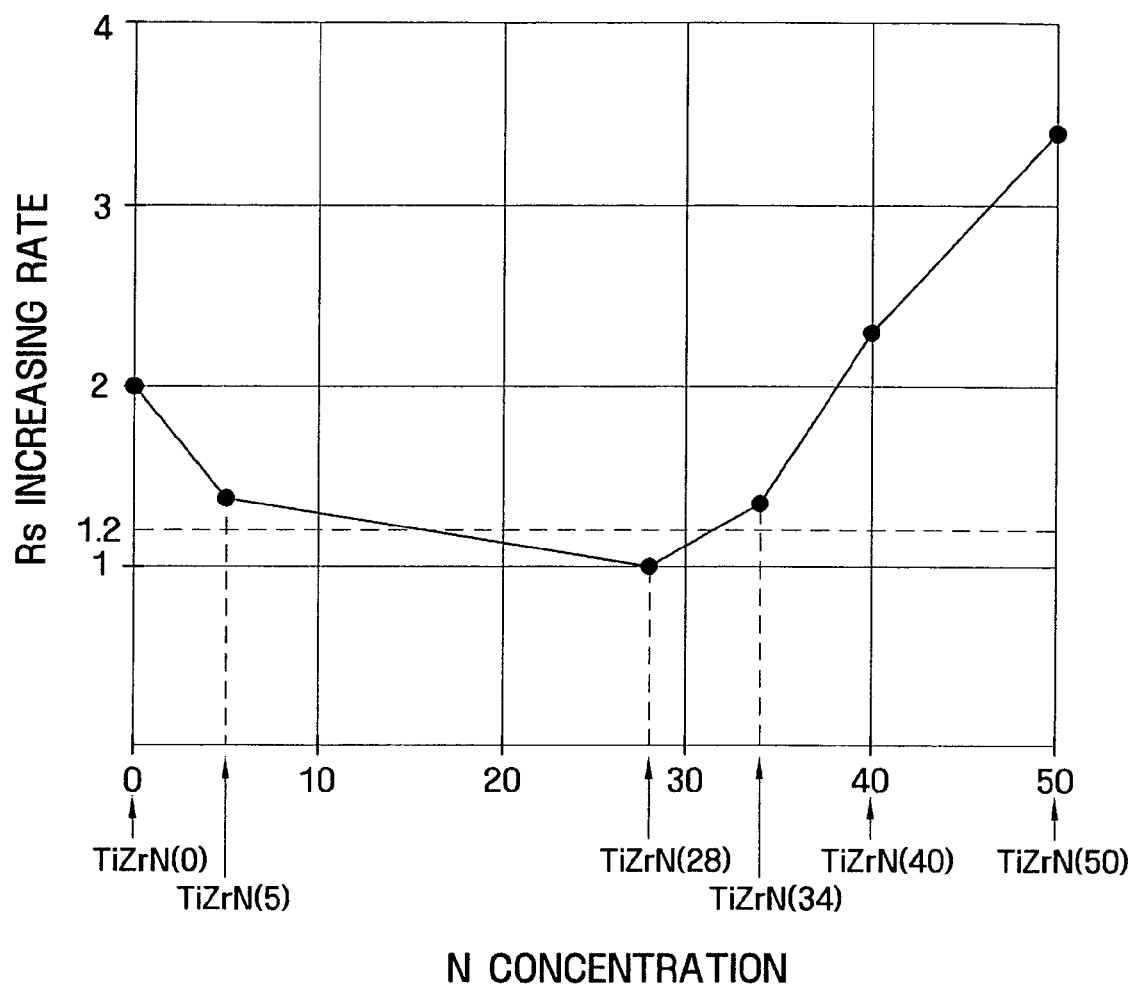
FIG. 8B is a graph illustrating an increase in the surface resistance of the samples shown in FIG. 8A before and after the annealing.

In addition, FIG. 8A is a graph illustrating surface resistance (Rs) levels of the samples of FIGS. 7A through 7F with respect to Cu as deposited and as annealed at a temperature of 400° C. for five minutes under a non-reactive gas atmosphere. FIG. 8B is a graph illustrating an increase in the surface resistance of the samples shown in FIG. 8A before and after the annealing.

Referring to FIGS. 7A through 7C, when the concentrations of nitrogen in metallic nitride layers are 0, 5, and 28 at %, the adherence property between the metallic nitride layer and Cu improves due to a wetting phenomenon. On the other hand, referring to FIGS. 7D through 7F, when the concentrations of nitrogen in metallic nitride layers are 34, 40, and 50 at %, the adherence property between the metallic nitride layer and Cu deteriorates due to a dewetting phenomenon.

Referring to FIGS. 8A and 8B, the surface resistance levels measured after depositing Cu on the metallic nitride layer are uniform.

When the concentration of nitrogen is about 28 at %, the surface resistance is not changed after annealing. However, in the cases of TiZrN(0), TiZrN(5), TiZrN(34), TiZrN(40), and TiZrN(50), the surface resistance levels are increased after annealing.

In general, when the Cu surface resistance is increased by less than 20% after annealing, an interconnect is considered as being reliable. Referring to the graph of FIG. 8B, a metallic nitride layer having less than 31 at % for the concentration of nitrogen and an amorphous structure may be used to realize a reliable interconnect. In addition, the concentration of nitrogen may be about 16 to 31 at %. In this case, even when the concentration of nitrogen is less than about 16 at %, a reliable interconnect can be realized due to the metallic nitride layer having the amorphous structure. When the metallic nitride layer is formed in the amorphous structure, the metallic nitride layer does not react with Cu well; thus the surface resistance does not increase. Accordingly, the metallic nitride layer having the amorphous structure can realize the reliable interconnect even when the concentration of nitrogen is less than 16 at %. In this case, the concentration of nitrogen, which determines the structure of the metallic nitride layer to the metallic structure or the amorphous structure, in the metallic nitride layer having less than 31 at % for the concentration of nitrogen can vary based on the transition metal or the transition metal alloy that composes the metallic nitride layer.

Furthermore, when the increasing rate of the surface resistance tolerated by the process margin changes, the concentration of nitrogen in the metallic nitride layer can change to realize the reliable interconnect.

In the cases of the metallic nitride layers having less than 31 at % N concentration and the metallic structure, for example, TiZrN(0) and TiZrN(5), the adhesive force between the metallic nitride layer and Cu is excellent but the surface resistance of Cu increases due to the reaction between the metallic nitride layer and Cu, as shown in FIGS. 7A and 7B. In addition, in the cases of the metallic nitride layers having over 31 at % N concentration, for example, TiZrN(34), TiZrN(40), and TiZrN(50), the adhesive force between the metallic nitride layer and Cu is deteriorated due to the dewetting phenomenon, resulting in the increase in the surface resistance of Cu, as shown in FIGS. 7D to 7F.

EXPERIMENTAL EXAMPLE 2

The effect of a metallic nitride layer formed of TiN on an interconnect characteristic was measured by the following method. A TiN layer was formed on a substrate to a thickness of 50 Å by reactive sputtering using a target, which was formed of Ti, while flowing Ar gas and $N_2$ gas. Thereafter, Cu is formed on the TiN layer to a thickness of 50 Å. In this case, six test samples including 0, 5, 28, 34, 40, and 50 at % of nitrogen in the TiN layer were prepared by differentiating the flow rate of $N_2$ gas. Then, the test samples were annealed at a temperature of 400° C. for two hours under a non-reactive gas atmosphere, for example, a vacuum, Ar gas, or inert gas.

Experimental Example 2 will now be described with reference to FIGS. 9A through 10B.

Figure 9A:
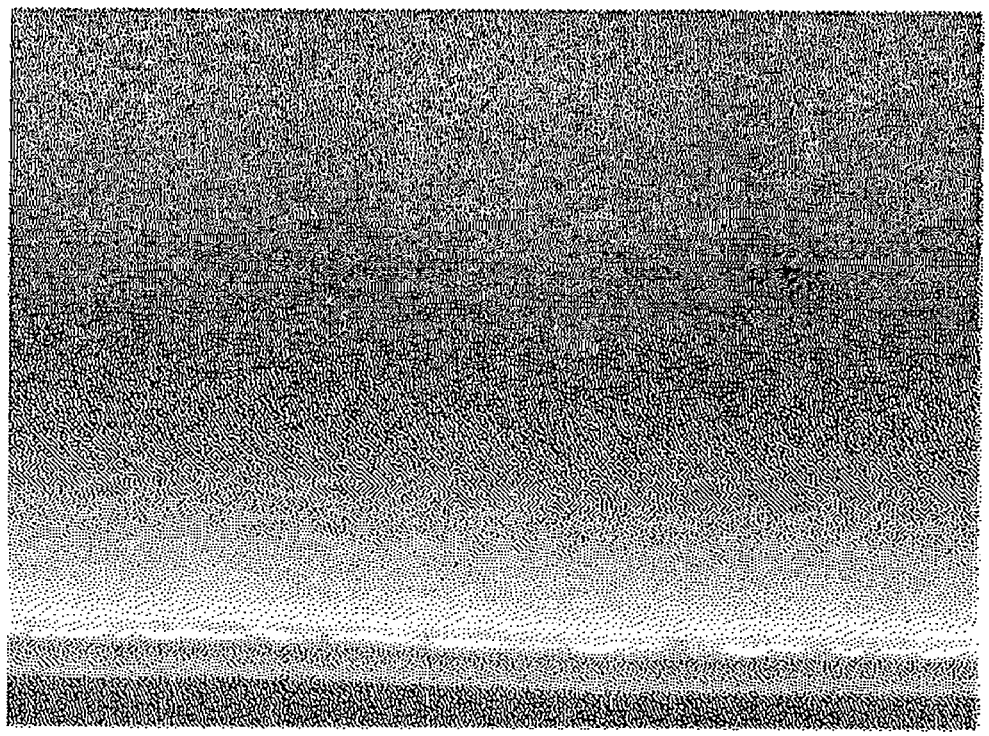
FIGS. 9A through 9F are SEM images illustrating the adhesion property between metallic nitride layers and Cu according to changes in the concentration of nitrogen.
Figure 9B:
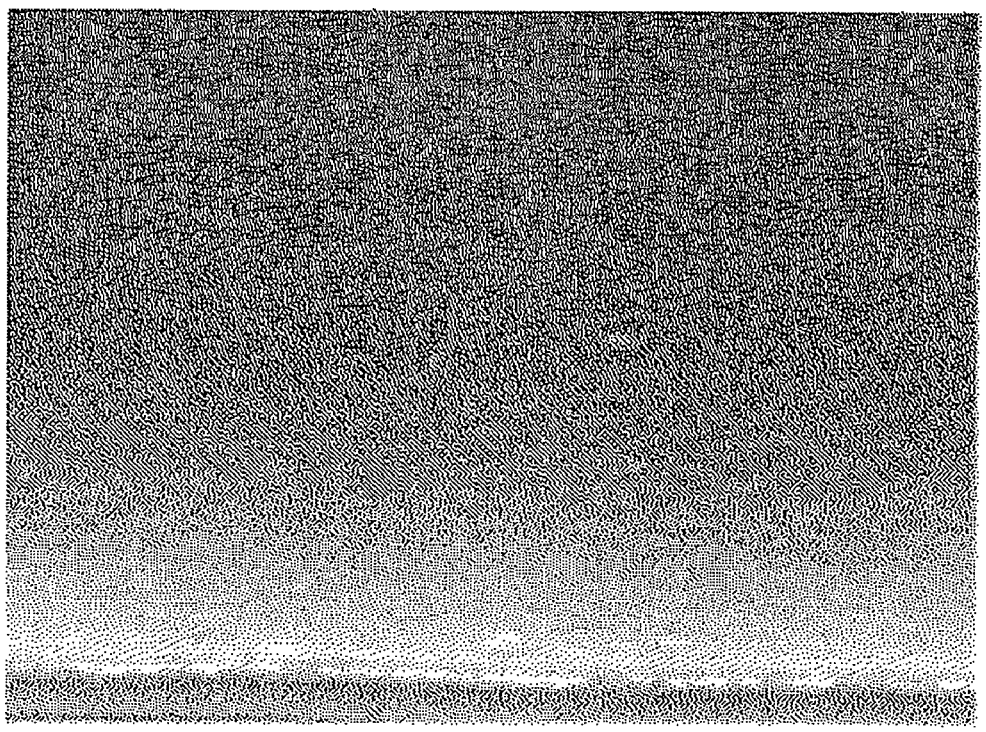
Figure 9C:
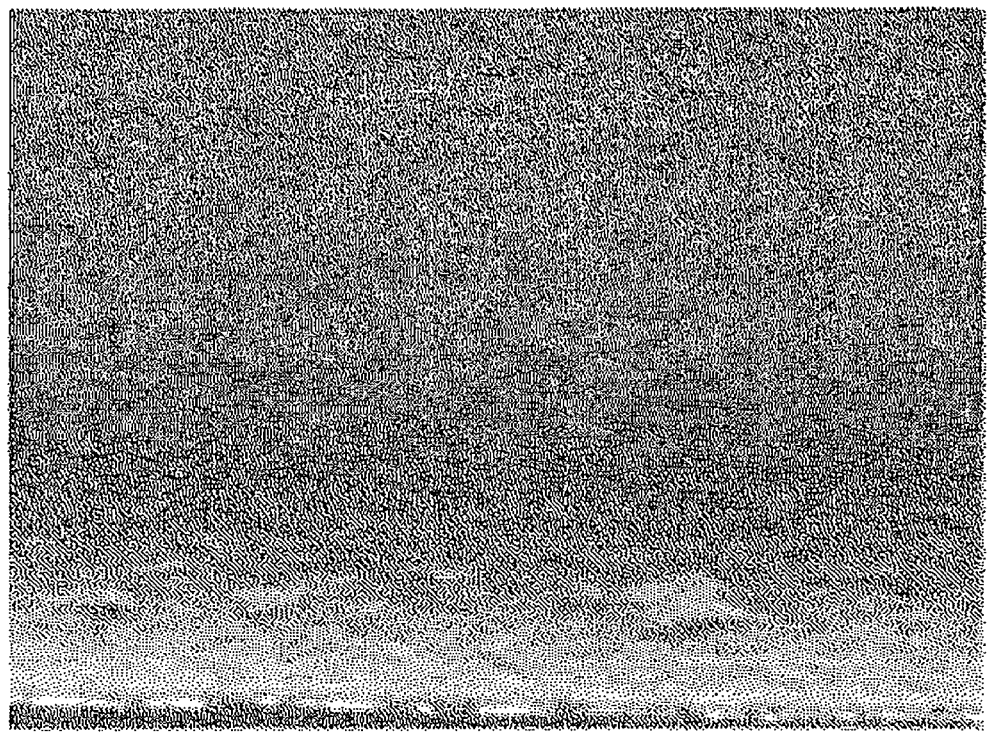
Figure 9D:
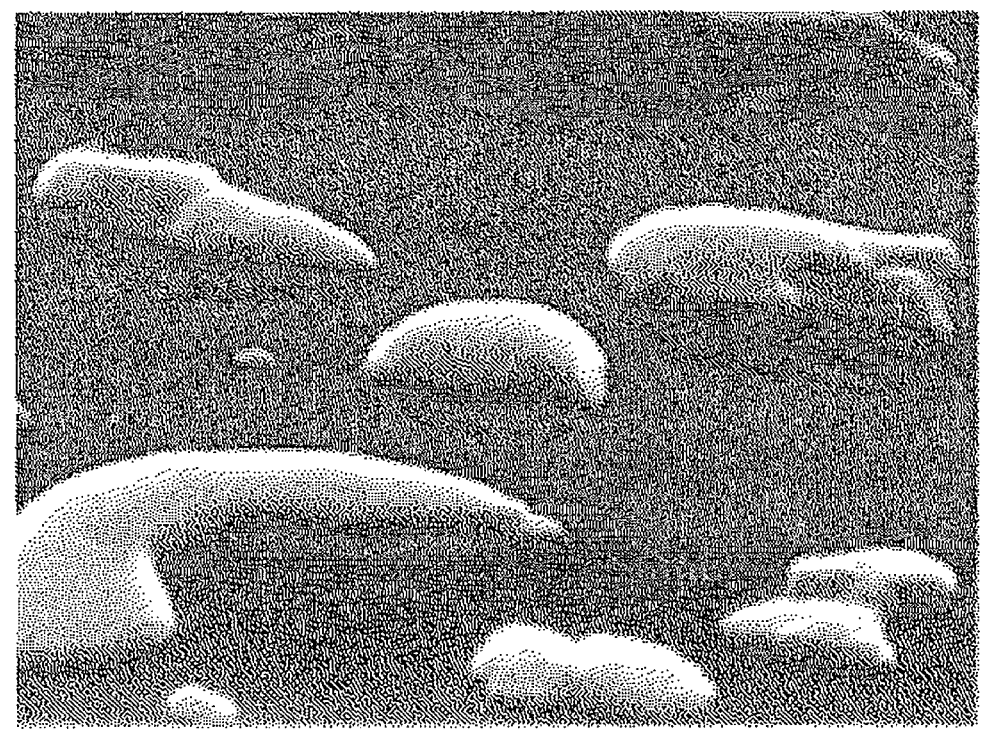
Figure 9E:
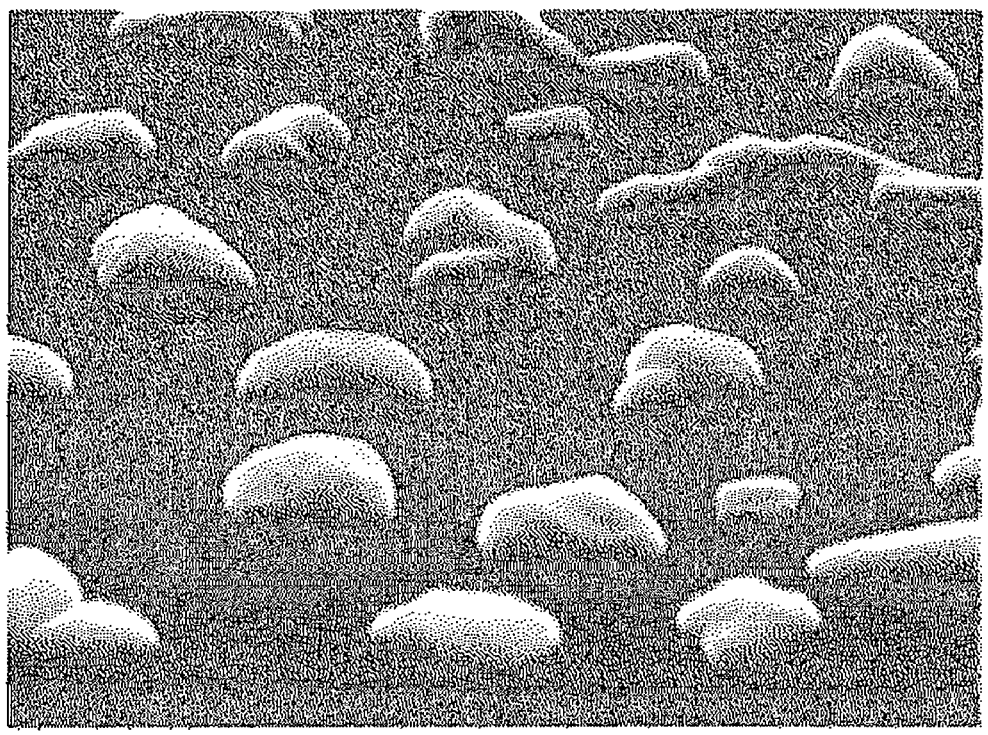
Figure 9F:

FIGS. 9A through 9F are SEM images of each test sample. FIG. 9A illustrates a TiN layer having 0% N concentration, which will be referred to as TiN(0) hereafter. FIG. 9B illustrates a TiN layer having 5% N concentration, which will be referred to as TiN(5) hereafter. FIG. 9C illustrates a TiN layer having 28% N concentration, which will be referred to as TiN(28) hereafter. FIG. 9D illustrates a TiN layer having 34% N concentration, which will be referred to as TiN(34) hereafter. FIG. 9E illustrates a TiN layer having 40% N concentration, which will be referred to as TiN(40) hereafter. FIG. 9F illustrates a TiN layer having 50% N concentration, which will be referred to as TiN(50) hereafter.

Figure 10A:
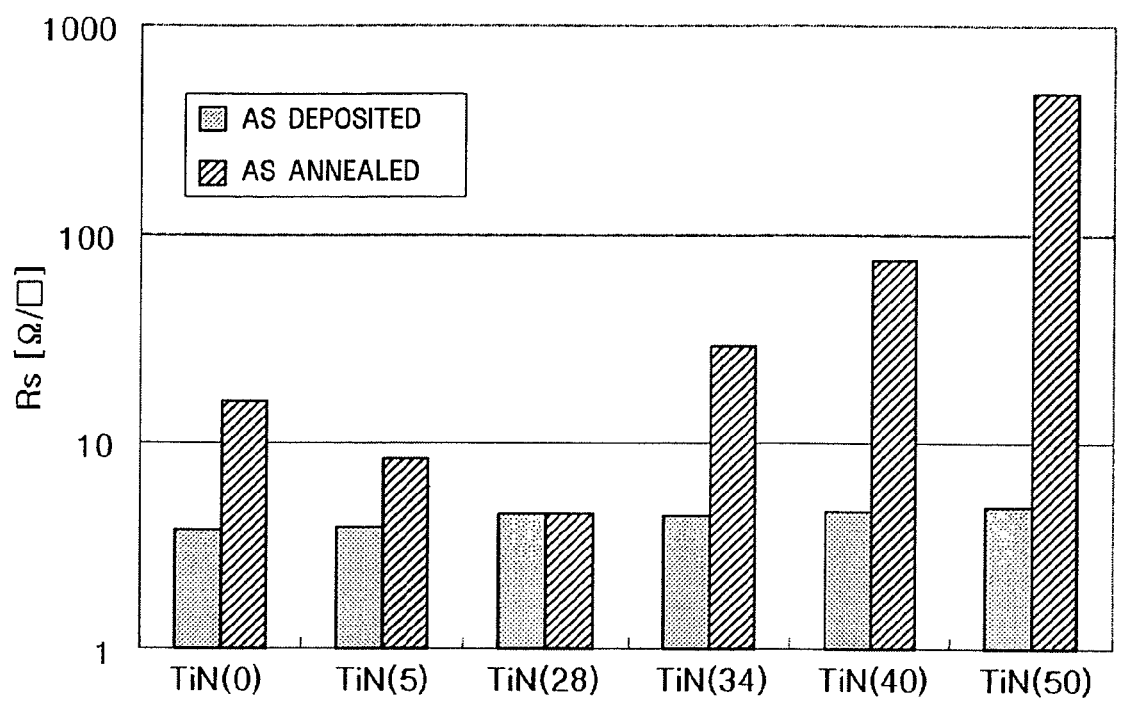
FIG. 10A is a graph illustrating surface resistance levels of the samples of FIGS. 9A through 9F with respect to Cu as deposited and as annealed.
Figure 10B:
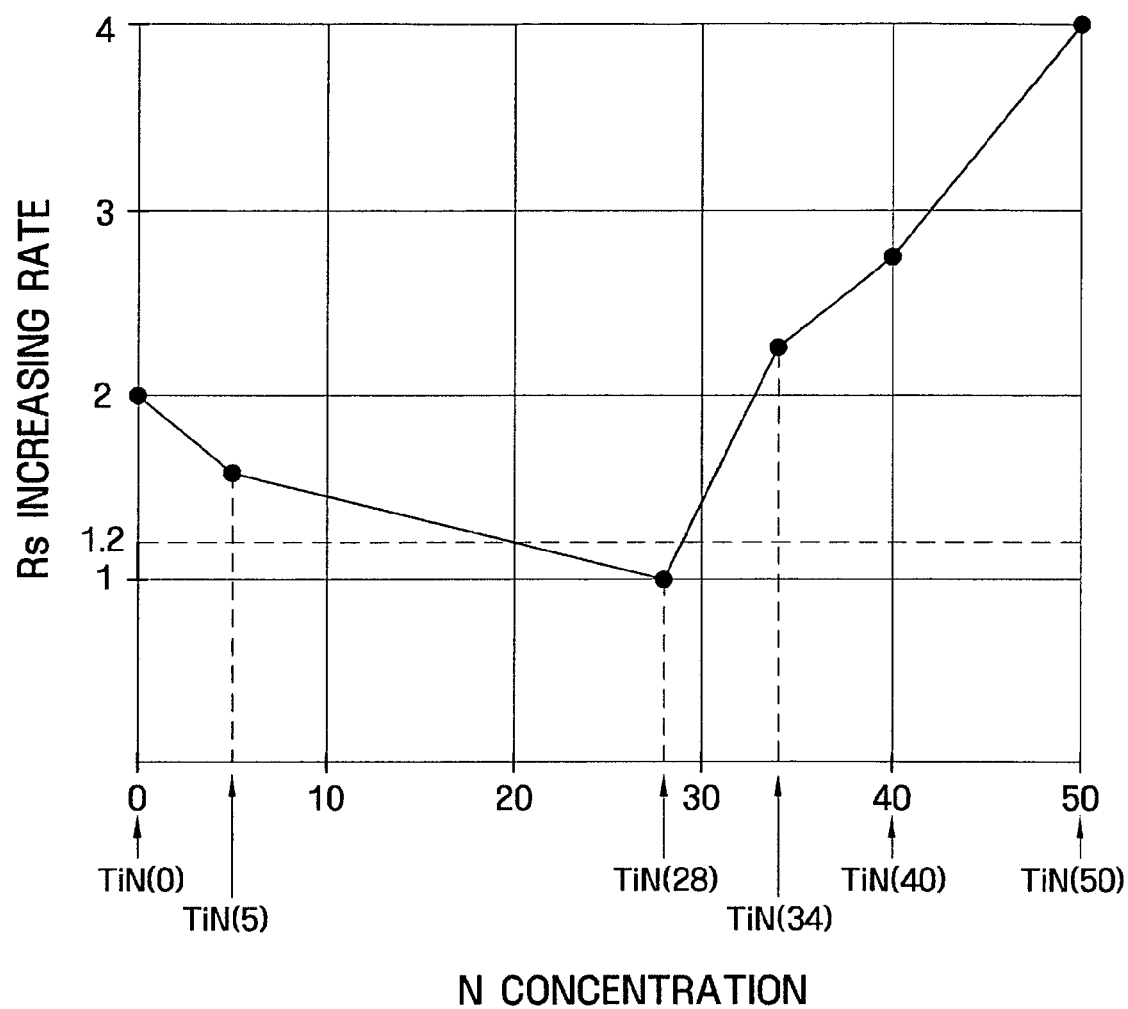
FIG. 10B is a graph illustrating an increase in the surface resistance of the samples shown in FIG. 10A before and after the annealing.

FIG. 10A is a graph illustrating surface resistance levels of the samples of FIGS. 9A through 9F with respect to Cu as deposited and as annealed, and FIG. 10B is a graph illustrating an increase in the surface resistance of the samples shown in FIG. 10A before and after the annealing.

Referring to FIGS. 9A through 9C, when the concentrations of nitrogen in metallic nitride layers are 0, 5, and 28 at %, the adherence property between the metallic nitride layer and Cu improves due to a wetting phenomenon. On the other hand, referring to FIGS. 9D through 9F, when the concentrations of nitrogen in metallic nitride layers are 34, 40, and 50 at %, the adherence property between the metallic nitride layer and Cu deteriorates due to a dewetting phenomenon.

Referring to FIGS. 10A and 10B, the surface resistance levels measured after depositing Cu on the metallic nitride layer are uniform.

When the concentration of nitrogen is about 28 at %, the surface resistance is not changed after annealing. However, in the cases of TiN(0), TiN(5), TiN(34), TiN(40), and TiN(50), the surface resistance levels are increased after annealing.

In general, when the Cu surface resistance is increased by less than 20% after annealing, an interconnect is considered as being reliable. Referring to the graph of FIG. 10B, a metallic nitride layer having less than 31 at %, preferably less than 29 at %, for the concentration of nitrogen and an amorphous structure may be used to realize a reliable interconnect. In addition, the concentration of nitrogen may be about 20 to 29 at %. In this case, even when the concentration of nitrogen is less than about 20 at %, a reliable interconnect can be realized due to the metallic nitride layer having the amorphous structure. When the metallic nitride layer is formed in the amorphous structure, the metallic nitride layer does not react with Cu well; thus the surface resistance does not increase. Accordingly, the metallic nitride layer having the amorphous structure can realize the reliable interconnect even when the concentration of nitrogen is less than 20 at %. In this case, the concentration of nitrogen, which determines the structure of the metallic nitride layer to the metallic structure or the amorphous structure, in the metallic nitride layer having less than 29 at % for the concentration of nitrogen can vary based on the transition metal or the transition metal alloy that composes the metallic nitride layer.

Furthermore, it will be understood by those skilled in the art that when the increasing rate of the surface resistance tolerated by the process margin changes, the concentration of nitrogen in the metallic nitride layer can change in order to realize the reliable interconnect.

In the cases of the metallic nitride layers having less than 29 at % N concentration and the metallic structure, for example TiN(0) and TiN(5), the adherence force between the metallic nitride layer and Cu is excellent but the surface resistance of Cu increases due to the reaction between the metallic nitride layer and Cu, as shown FIGS. 9A and 9B. In addition, in the cases of the metallic nitride layers having more than 29 at % N concentration, for example, TiN(34), TiN(40), and TiN(50), the adherence force between the metallic nitride layer and Cu is deteriorated due to a dewetting phenomenon, resulting in the increase in the surface resistance of Cu, as shown in FIGS. 9D to 9F.

According to the semiconductor device and a method of manufacturing the same according to the present invention, a reliable interconnect can be realized.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
   a substrate;
   an inter-metal dielectric (IMD) pattern formed on the substrate and having an opening;
   an amorphous metallic nitride layer formed on an inner surface of the opening;
   a diffusion barrier layer formed on the amorphous metallic nitride layer; and
   a conductive layer filled into the opening having the diffusion barrier layer,
   wherein the amorphous metallic nitride layer is formed of at least one of a transition metal nitride and a transition metal alloy nitride.

2. The semiconductor device of claim 1, wherein the concentration of nitrogen of the amorphous metallic nitride layer is less than about 31 at %.

3. The semiconductor device of claim 1, wherein the amorphous metallic nitride layer is formed of a nitride selected from the group consisting of Ti-nitride, Zr-nitride, and Hf-nitride, or formed of an alloy of two or more of Ti-nitride, Zr-nitride and Hf-nitride.

4. The semiconductor device of claim 1, wherein the amorphous metallic nitride layer further includes at least one of Mg, In, Sn, and Al in the amount of about 1 to 10 at %.

5. The semiconductor device of claim 1, wherein the thickness of the amorphous metallic nitride layer is 10 to 1,000 Å.

6. The semiconductor device of claim 1, wherein the diffusion barrier layer is a single layer formed of a material selected from the group consisting of Ta, Ti, W, Ru, TiW, WBN, TaN, TiN, WN, TaC, WC, TiSiN, and TaSiN, or a multi-layer formed of two or more materials selected from the group consisting of these materials.

7. The semiconductor device of claim 1, further comprising an additional amorphous metallic nitride layer formed between the diffusion barrier layer and the conductive layer.

8. The semiconductor device of claim 7, wherein the additional amorphous metallic nitride layer is formed of at least one of a transition metal nitride and a transition metal alloy nitride.

9. The semiconductor device of claim 8, wherein the additional amorphous metallic nitride layer is formed of a nitride selected from the group consisting of Ti-nitride, Zr-nitride, Hf-nitride, or an alloy of two or more of Ti-nitride, Zr-nitride, and Hf-nitride.

10. The semiconductor device of claim 8, wherein the additional amorphous metallic nitride layer further includes at least one of Mg, In, Sn, and Al in the amount of about 1 to 10 at %.

11. The semiconductor device of claim 8, wherein the thickness of the additional amorphous metallic nitride layer is 10 to 1,000 Å.

12. The semiconductor device of claim 8, wherein the concentration of nitrogen of the additional amorphous metallic nitride layer is less than about 31 at %.

13. A method of manufacturing a semiconductor device, the method comprising:
    forming a substrate;
    forming an inter-metal dielectric (IMD) pattern having an opening on the substrate;
    sequentially forming an amorphous metallic nitride layer and a diffusion barrier layer on an inner surface of the opening; and
    forming a conductive layer filled into the opening,
    wherein the amorphous metallic nitride layer is formed of at least one of transition metal nitride and a transition metal alloy nitride.

14. The method of claim 13, wherein a substrate having a lower interconnect is provided in the step of forming the substrate, and forming the IMD pattern includes forming the IMD pattern having a via exposing the lower interconnect and a trench connected to the via and defining another interconnect.

15. The method of claim 13, wherein the amorphous metallic nitride layer is formed of a nitride selected from the group consisting of Ti-nitride, Zr-nitride, and Hf-nitride, or formed of an alloy of two or more of Ti-nitride, Zr-nitride, and Hf-nitride.

16. The method of claim 13, wherein the amorphous metallic nitride layer further includes at least one of Mg, In, Sn, and Al in the amount of about 1 to 10 at %.

17. The method of claim 13, wherein the thickness of the amorphous metallic nitride layer is 10 to 1,000 Å.

18. The method of claim 13, wherein the concentration of nitrogen of the amorphous metallic nitride layer is less than about 31 at %.

19. The method of claim 13, further comprising forming an additional amorphous metallic nitride layer on the diffusion barrier layer before forming the conductive layer.

20. The method of claim 19, wherein the additional amorphous metallic nitride layer is formed of at least one of a transition metal nitride and a transition metal alloy nitride.

21. The method of claim 20, wherein the additional amorphous metallic nitride layer is formed of a nitride selected from the group consisting of Ti-nitride, Zr-nitride, and Hf-nitride, or formed of an alloy of two or more of Ti-nitride, Zr-nitride, and Hf-nitride.

22. The method of claim 20, wherein the additional amorphous metallic nitride layer further includes at least one of Mg, In, Sn, and Al in the amount of about 1 to 10 at %.

23. The method of claim 20, wherein the thickness of the additional amorphous metallic nitride layer is 10 to 1,000 Å.

24. The method of claim 20, wherein the concentration of nitrogen of the additional amorphous metallic nitride layer is less than about 31 at %.

25. The method of claim 13, wherein the forming of the conductive layer includes forming the conductive layer having an upper surface at the same level as the upper surface of the IMD pattern.

26. The method of claim 25, wherein the forming of the conductive layer comprises:
    forming a seed layer on the diffusion barrier layer; and
    electroplating the conductive layer on the seed layer.

27. A semiconductor device comprising:
    a substrate;
    an inter-metal dielectric (IMD) pattern formed on the substrate and having an opening;
    an amorphous metallic nitride layer formed on an inner surface of the opening;
    a diffusion barrier layer formed on the amorphous metallic nitride layer;
    a conductive layer filled into the opening having the diffusion barrier layer; and
    an additional amorphous metallic nitride layer formed between the diffusion barrier layer and the conductive layer, wherein the additional amorphous metallic nitride layer is formed of at least one of a transition metal nitride and a transition metal alloy nitride.

28. The semiconductor device of claim 27, wherein the additional amorphous metallic nitride layer is formed of a nitride selected from the group consisting of Ti-nitride, Zr-nitride, Hf-nitride, or an alloy of two or more of Ti-nitride, Zr-nitride, and Hf-nitride.

29. The semiconductor device of claim 27, wherein the additional amorphous metallic nitride layer further includes at least one of Mg, In, Sn, and Al in the amount of about 1 to 10 at %.

30. The semiconductor device of claim 27, wherein the concentration of nitrogen of the additional amorphous metallic nitride layer is less than about 31 at %.

31. A method of manufacturing a semiconductor device, the method comprising:
    forming a substrate;
    forming an inter-metal dielectric (IMD) pattern having an opening on the substrate;
    sequentially forming an amorphous metallic nitride layer and a diffusion barrier layer on an inner surface of the opening;

forming a conductive layer filled into the opening; and forming an additional amorphous metallic nitride layer on the diffusion barrier layer before forming the conductive layer, wherein the additional amorphous metallic nitride layer is formed of at least one of a transition metal nitride and a transition metal alloy nitride.

32. The method of claim 31, wherein the additional amorphous metallic nitride layer is formed of a nitride selected from the group consisting of Ti-nitride, Zr-nitride, and Hf-nitride, or formed of an alloy of two or more of Ti-nitride, Zr-nitride, and Hf-nitride.

33. The method of claim 31, wherein the additional amorphous metallic nitride layer further includes at least one of Mg, In, Sn, and Al in the amount of about 1 to 10 at %.

34. The method of claim 33, wherein the concentration of nitrogen of the additional amorphous metallic nitride layer is less than about 31 at %.

* * * * *